(12) United States Patent
Hatakeyama et al.

(10) Patent No.: US 7,303,855 B2
(45) Date of Patent: Dec. 4, 2007

(54) PHOTORESIST UNDERCOAT-FORMING MATERIAL AND PATTERNING PROCESS

(75) Inventors: Jun Hatakeyama, Niigata-ken (JP); Satoshi Watanabe, Niigata-ken (JP)

(73) Assignee: Shin-Etsu Chemical Co., Ltd., Tokyo (JP)

(*) Notice: Subject to any disclaimer, the term of this patent is extended or adjusted under 35 U.S.C. 154(b) by 65 days.

(21) Appl. No.: 10/952,834

(22) Filed: Sep. 30, 2004

(65) Prior Publication Data

US 2006/0019195 A1 Jan. 26, 2006

(30) Foreign Application Priority Data

Oct. 3, 2003 (JP) ............... 2003-345128

(51) Int. Cl.
- G03C 1/73 (2006.01)
- G03C 1/76 (2006.01)
- G03F 7/095 (2006.01)
- G03F 7/09 (2006.01)
- G03F 7/30 (2006.01)
- G03F 7/36 (2006.01)

(52) U.S. Cl. ............... 430/270.1; 430/271.1; 430/272.1; 430/914; 430/919; 430/920; 430/921; 430/925; 430/325; 430/326; 430/313; 430/316; 430/317; 430/318; 430/323; 430/329

(58) Field of Classification Search ............ 430/270.1, 430/325, 326, 313, 317, 311, 323
See application file for complete search history.

(56) References Cited

U.S. PATENT DOCUMENTS

| | | |
|---|---|---|
| 6,316,165 B1 | 11/2001 | Pavelchek et al. |
| 6,420,088 B1 | 7/2002 | Angelopoulos et al. |
| 6,506,497 B1 | 1/2003 | Kennedy et al. |
| 2002/0086934 A1 | 7/2002 | Kawaguchi et al. |
| 2003/0113662 A1* | 6/2003 | Kato et al. ............... 430/270.1 |
| 2003/0166796 A1* | 9/2003 | Imaizumi et al. ........... 525/534 |

FOREIGN PATENT DOCUMENTS

| | | | |
|---|---|---|---|
| JP | 3-14815 | * | 1/1991 |
| JP | 6-118651 A | | 4/1994 |
| JP | 09-31147 | * | 2/1997 |
| JP | 9-31147 | * | 2/1997 |
| JP | 9-110938 A | | 4/1997 |
| JP | 10-324748 A | | 12/1998 |

(Continued)

OTHER PUBLICATIONS

Chem. Abstract 126:225983—English abstract for JP 9-31147.*

(Continued)

*Primary Examiner*—Sin Lee
(74) *Attorney, Agent, or Firm*—Birch, Stewart, Kolasch & Birch, LLP

(57) ABSTRACT

An undercoat-forming material comprising a novolak resin having a fluorene or tetrahydrospirobiindene structure, an organic solvent, an acid generator, and a crosslinker, optionally combined with an intermediate layer having an antireflective effect, has an absorptivity coefficient sufficient to provide an antireflective effect at a thickness of at least 200 nm and a high etching resistance as demonstrated by slow etching rates with $CF_4/CHF_3$ and $Cl_2$. $BCl_3$ gases for substrate processing.

20 Claims, 6 Drawing Sheets

FOREIGN PATENT DOCUMENTS

| | | |
|---|---|---|
| JP | 11-24271 A | 1/1999 |
| JP | 11-302382 A | 11/1999 |
| JP | 2000-294504 A | 10/2000 |
| JP | 2001-40293 A | 2/2001 |
| JP | 2002-14474 A | 1/2002 |
| JP | 2002-55456 A | 2/2002 |
| JP | 2002-214777 A | 7/2002 |

OTHER PUBLICATIONS

English abstract for JP 3-14815 as provided by JPO.*
Chemical Abstract 1997:247694—English abstract for JP 9-31147.*
Machine-assisted English translation of JP 09-031147 (Ishihara et al) provided by JPO.*

Brunsvold et al., "Evaluation of a deep UV bilayer resist for sub-half micron lithography", SPIE, vol. 1925, No. 377, (1993), pp. 377-387.

Hatakeyama et al., "Investigation of discrimination enhancement in polysilsesquioxane based positive resist for ArF lithography", SPIE, vol. 3333 (1998), pp. 62-72.

Schaedeli et al., "Evaluation of materials for 193-nm lithography", Journal of Photpolymer Science and Technology, vol. 9, No. 3 (1996), pp. 435-446.

Kwong et al., "IBM 193 nm bilayer resist: materials, lithographic performance and optimization", SPIE, vol. 4345 (2001), pp. 50-57.

Lynch et al., "Properties and performance of near UV reflectivity control layers", SPIE, vol. 2195 (1994), pp. 225-235.

* cited by examiner

SUBSTRATE REFLECTANCE
INTERMEDIATE LAYER n=1.5, VARYING k

INTERMEDIATE LAYER THICKNESS (nm)

☐ 0-1  ☐ 1-2  ☐ 2-3  ☐ 3-4  ■ 4-5      SUBSTRATE REFLECTANCE (%)

SUBSTRATE REFLECTANCE
INTERMEDIATE LAYER n=1.5, k=0.1
UNDERCOAT LAYER n=1.5, k=0.2

UNDERCOAT LAYER THICKNESS (nm)

☐ 0-1  ☐ 1-2  ☐ 2-3  ☐ 3-4  ■ 4-5      SUBSTRATE REFLECTANCE (%)

SUBSTRATE REFLECTANCE
INTERMEDIATE LAYER n=1.5, k=0.1
UNDERCOAT LAYER n=1.5, k=0.6

PHOTORESIST UNDERCOAT-FORMING MATERIAL AND PATTERNING PROCESS

CROSS-REFERENCE TO RELATED APPLICATION

This non-provisional application claims priority under 35 U.S.C. §119(a) on Patent Application No. 2003-345128 filed in Japan on Oct. 3, 2003, the entire contents of which are hereby incorporated by reference.

This invention relates to an undercoat-forming material useful in a multilayer resist technology for micropatterning in a process for the fabrication of semiconductor devices or the like, and a resist pattern-forming process adapted for exposure to KrF excimer laser (248 nm), ArF excimer laser (193 nm), $F_2$ laser (157 nm), $Kr_2$ laser (146 nm), $Ar_2$ laser (126 nm) beams, soft X-rays, electron beams, ion beams and X-rays, using the same.

BACKGROUND OF THE INVENTION

While a number of recent efforts are being made to achieve a finer pattern rule in the drive for higher integration and operating speeds in LSI devices, the commonly used light exposure lithography is approaching the essential limit of resolution determined by the light source wavelength.

As the light source used in the lithography for resist pattern formation, g-line (436 nm) or i-line (365 nm) from a mercury lamp has been widely used. One means believed effective for further reducing the feature size is to reduce the wavelength of exposure light. For the mass production process of 64 M-bit DRAM, the exposure light source of i-line (365 nm) was replaced by a KrF excimer laser having a shorter wavelength of 248 nm. However, for the fabrication of DRAM with a degree of integration of 1 G or more requiring a finer patterning technology (processing fetaure size 0.13 µm or less), a shorter wavelength light source is required. In particular, photolithography using ArF excimer laser light (193 nm) is now under investigation.

On the other hand, it is known in the art that the bi-layer resist process is advantageous in forming a high-aspect ratio pattern on a stepped substrate. In order that a bilayer resist film be developable with a common alkaline developer, high molecular weight silicon compounds having hydrophilic groups such as hydroxyl and carboxyl groups must be used.

Among silicone based chemically amplified positive resist compositions, recently proposed were those compositions for KrF laser exposure comprising a base resin in the form of polyhydroxybenzylsilsesquioxane, which is a stable alkali-soluble silicone polymer, in which some phenolic hydroxyl groups are blocked with t-BOC groups, in combination with a photoacid generator (see JP-A 6-118651 and SPIE vol. 1925 (1993), p. 377. For ArF laser exposure, positive resist compositions comprising as a base a silsesquioxane of the type in which cyclohexylcarboxylic acid has substituted thereon an acid labile group were proposed (see JP-A 10-324748, JP-A 11-302382, and SPIE vol. 3333 (1998), p. 62). For $F_2$ laser exposure, positive resist compositions based on a silsesquioxane having haxafluoroisopropanol as a dissolvable group were proposed (see JP-A 2002-55456). The above polymer bears in its backbone a polysilsesquioxane containing a ladder skeleton produced through polycondensation of a trialkoxysilane or trihalosilane.

Silicon-bearing (meth)acrylate polymers were proposed as a resist base polymer having silicon pendants on side chains (see JP-A 9-110938, J. Photopolymer Sci. and Technol., Vol. 9, No. 3 (1996), pp. 435-446).

The undercoat layer of the bilayer resist process is formed of a hydrocarbon compound which can be etched with oxygen gas, and must have high etching resistance since it serves as a mask when the underlying substrate is subsequently etched. For oxygen gas etching, the undercoat layer must be formed solely of a silicon atom-free hydrocarbon. To improve the line-width controllability of the upper layer of silicon-bearing resist and to minimize the sidewall corrugation and pattern collapse by standing waves, the undercoat layer must also have the function from the undercoat coat layer back into the resist film must be reduced to below 1%.

Now, the results of calculation of reflectance at film thickness varying up to the maximum of 500 nm are shown in FIGS. 1 and 2. Assume that the exposure wavelength is 193 nm, and the topcoat resist has an n value of 1.74 and a k value of 0.02. FIG. 1 shows substrate reflectance when the undercoat layer has a fixed k value of 0.3, the n value varies from 1.0 to 2.0 on the ordinate and the film thickness varies from 0 to 500 nm on the abscissa. Assuming that the undercoat layer of the bilayer resist process has a thickness of 300 nm of greater, optimum values at which the reflectance is reduced to or below 1% exist in the refractive index range of 1.6 to 1.9 which is approximate to or slightly higher than that of the topcoat resist.

FIG. 2 shows substrate reflectance when the undercoat layer has a fixed n value of 1.5 and the k value varies from 0.1 to 0.8. In the k value range of 0.24 to 0.15, the reflectance can be reduced to or below 1%. By contrast, the antireflective film used in the form of a thin filme of about 40 nm thickin the monolayer resist process has an optimum k value in the range of 0.4 to 0.5, which differs from the optimum k value of the undercoat layer used with a thickness of 300 nm or greater in the bilayer resist process. For the undercoat layer in the bilayer resist process, an undercoat layer having a lower k value, that is, more transparent is necessary.

As the material for forming an undercoat layer in 193 nm lithography, copolymers of polyhydroxystyrene with acrylic compounds are under study as described in SPIE vol. 4345, p. 50 (2001). Polyhydroxystyrene has a very strong absorption at 193 nm and its k value is as high as around 0.6 by itself. By copolymerizing with an acrylic compound having a k value of almost 0, the k value of the copolymer is adjusted to around 0.25.

However, the resistance of the acrylic compound to substrate etching is weak as compared with polyhydroxystyrene, and a considerable proportion of the acrylic compound must be copolymerized in order to reduce the k value. As a result, the resistance to substrate etching is considerably reduced. The etching resistance is not only reflected by the etching speed, but also evidenced by the development of surface roughness after etching. Through copolymerization of acrylic compound, the surface roughness after etching is increased is one of rings that have a more transparency at 193 nm and a higher etching resistance than benzene ring. JP-A 2002-14474 proposes an undercoat layer having a naphthalene or anthracene ring. However, since naphthol-copolycondensed novolak resin and polyvinyl naphthalene resin have k values in the range of 0.3 to 0.4, the target transparency corresponding to a k value of 0.1 to 0.3 is not reached, with a further improvement in transparency being necessary. The naphthol-copolycondensed novolak resin and polyvinyl naphthalene resin have low n values at 193 nm, as evidenced by a value of 1.4 for the naphthol-copolycondensed novolak resin and a value of only 1.2 for the polyvinyl naphthalene resin when the inventors measured.

JP-A 2001-40293 and JP-A 2002-214777 describe acenaphthylene polymers which have lower n values and higher k values at the wavelength of 193 nm than at 248 nm, both falling outside the target values. There is a need for an undercoat layer having a high n value, a low k value, transparency and high etching resistance.

Also proposed was a tri-layer process of stacking a silicon-free monolayer resist as a topcoat, an intermediate layer containing silicon below the resist, and an organic undercoat below the intermediate layer. See J. Vac. Sci. Technol., 16(6), November/December 1979. Since the monolayer resist generally provides better resolution than the silicon-bearing resist, the tri-layer process permits such a high resolution monolayer resist to be used as an imaging layer for light exposure. A spin-on-glass (SOG) coating is used as the intermediate layer. A number of SOG coatings have been proposed.

In the tri-layer process, the optimum optical constants of the undercoat layer for controlling reflection from the substrate are different from those in the bilayer process. The purpose of minimizing substrate reflection, specifically to a level of 1% or less is the same between the bi- and tri-layer processes. In the bilayer process, only the undercoat layer is endowed with the antireflective effect. In the tri-layer process, either one or both of the intermediate layer and the undercoat layer may be endowed with the antireflective effect.

U.S. Pat. No. 6,506,497 and U.S. Pat. No. 6,420,088 disclose silicon-bearing layer materials endowed with antireflective effect. In general, a multi-layer antireflective coating has greater antireflective effect than a monolayer antireflective coating and commercialy widely used as an antireflective film for optical articles. A higher antireflective effect is obtainable by imparting an antireflective effect to both an intermediate layer and an undercoat layer. If the silicon-bearing intermediate layer in the tri-layer process is endowed with the function of an antireflective coating, the undercoat layer need not necessarily posses the maximum function of an antireflective coating. In the tri-layer process, the undercoat layer is required to have high etching resistance during substrate processing rather than the antireflective coating effect. Then a novolak resin having high etching resistance and containing more aromatic groups must be used as the undercoat layer in the tri-layer process.

FIG. 3 illustrates substrate reflectance with a change of the k value of the intermediate layer. It is seen that by setting a k value as low as 0.2 or less and an appropriate thickness to the intermediate layer, a satisfactory antireflective effect as demonstrated by a substrate reflectance of up to 1% is achievable. In general, the antireflective coating must have a k value of 0.2 or greater in order to reduce reflectance to 1% at a coating thickness of 100 nm or less (see FIG. 2). In the tri-layer structure wherein the undercoat layer serves to restrain reflection to a certain extent, the intermediate layer may have an optimum k value of less than 0.2.

FIGS. 4 and 5 illustrate changes of reflectance with the varying thickness of the intermediate layer and undercoat layer, when the undercoat layer has a k value of 0.2 and 0.6, respectively. The undercoat layer having a k value of 0.2 assumedly corresponds to the undercoat layer optimized for the bilayer process, and the k value of 0.6 for the undercoat layer is approximate to the k values at 193 nm of novolak and polyhydroxystyrene. The thickness of the undercoat layer varies with the topography of the substrate whereas the thickness of the intermediate layer is kept substanitally unchanged so that presumably it can be coated to the predetermined thickness. The undercoat layer with a higher k value (0.6) is effective in reducing reflectance to 1% or less with a thinner film. In the event where the undercoat layer has a k value of 0.2 and a thickness of 250 nm, in order to provide a reflectance of 1%, the intermediate layer must be increased in thickness. Increasing the thickness of the intermediate layer is not preferable because a greater load is applied to the topcoat of resist during dry etching of the intermediate layer. To use the undercoat layer in thin film form, it must have not only a high k value, but also greater etching resistance.

JP-A 11-24271 discloses a heat resistant, positive, i-line resist comprising a fluorene or tetrahydrospirobiindene structure novolak as a base resin and a quinonediazide photosensitizer.

The present invention proposes to use a flurene or tetrahydrospirobiindene structure novolak as an undercoat layer in the multilayer process. The resulting undercoat layer is fully resistant to dry etching during substrate processing.

The undercoat layer of the invention is primarily applicable to the tri-layer process. The undercoat layer provides substantial substrate reflection when used in the bilayer process using KrF or ArF, due to a high k value for that use, but when combined with an intermediate layer having an antireflective effect, can reduce the substrate reflectance to 1% or less.

SUMMARY OF THE INVENTION

An object of the present invention is to provide an undercoat-forming material comprising a fluorene or tetrahydrospirobiindene structure nonolak as a base resin, which material is useful as an undercoat layer in the bi- or tri-layer resist technology and has greater etching resistance than polyhydroxystyrene and cresol nonolak resin, and a pattern-forming process using the same.

The inventors have discovered that a novolak resin having a fluorene or tetrahydrospirobiindene structure is a promising material to form an undercoat layer for the bi- or tri-layer resist technology and has improved etching resistance.

More particularly, the invention relates to a material for forming an undercoat layer in the bi- or tri-layer resist technology, comprising a novolak resin having a fluorene or tetrahydrospirobiindene structure as a base resin, which material has improved etching resistance and is adpated for exposure to high-energy radiation of less than 300 nm wavelength, specifically excimer lasers at 248, 193 and 157 nm, soft x-rays of 3 to 20 nm, electron beams and x-rays. The material is fully resistant to dry etching during substrate processing.

Accordingly, the present invention provides an undercoat-forming material and a pattern-forming process as defined below.

In one aspect, the invention provides an undercoat-forming material comprising a novolak resin having a fluorene or tetrahydrospirobiindene structure.

In a preferred embodiment, the novolak resin having a fluorene or tetrahydrospirobiindene structure comprises recurring units of the general formula (1a) or (1b).

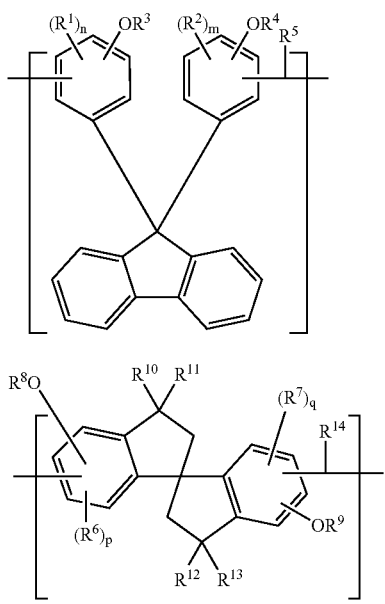

Herein $R^1$, $R^2$, $R^6$ and $R^7$ are each independently hydrogen, a straight, branched or cyclic $C_1$-$C_{10}$ alkyl group, a $C_6$-$C_{10}$ aryl group, allyl or halogen atom; $R^3$, $R^4$, $R^8$ and $R^9$ are each independently hydrogen, a straight, branched or cyclic $C_1$-$C_6$ alkyl group, a straight, branched or cyclic $C_2$-$C_6$ alkenyl group, a $C_6$-$C_{10}$ aryl group or a glycidyl group; $R^5$ and $R^{14}$ are each independently hydrogen, a straight, branched or cyclic $C_1$-$C_{10}$ alkyl group or a $C_6$-$C_{10}$ aryl group; n, m, p and q are each an integer of 1 to 3; $R^{10}$ to $R^{13}$ are each independently hydrogen, halogen, hydroxyl, a straight, branched or cyclic $C_1$-$C_6$ alkyl group or a straight, branched or cyclic $C_1$-$C_6$ alkoxy group.

The preferred undercoat-forming material may further comprise at least one of an organic solvent, an acid generator, and a crosslinker.

In another aspect, the invention provides a patterning process comprising the steps of applying the undercoat-forming material defined above onto a processable substrate to form an undercoat layer; applying a photoresist composition onto the undercoat layer to form a photoresist layer; exposing the photoresist layer in a predetermined region to radiation; developing the photoresist layer with a developer to form a photoresist pattern; and processing the undercoat layer and the substrate through the patterned photoresist layer as a maks, by means of a dry etching apparatus. Preferably, the photoresist composition comprises a silicon atom-bearing polymer, and the processing step includes dry etching the undercoat layer through the photoresist layer as a mask with an oxygen-based etching gas.

In a further aspect, the invention provides a patterning process comprising the steps of applying the undercoat-forming material defined above onto a processable substrate to form an undercoat layer; applying a silicon atom-containing intermediate layer over the undercoat layer; applying a photoresist composition onto the intermediate layer to form a photoresist layer; exposing the photoresist layer in a predetermined region to radiation; developing the photoresist layer with a developer to form a photoresist pattern; processing the intermediate layer through the patterned photoresist layer as a mask; removing the patterned photoresist layer; and processing the undercoat layer and then the substrate through the processed intermediate layer as a mask, the processing steps using a dry etching apparatus. Preferably, the photoresist composition comprises a silicon atom-free polymer, and the step of processing the undercoat layer includes dry etching with an oxygen-based etching gas.

The undercoat-forming material of the invention, optionally combined with an intermediate layer having an antireflective effect, has an abosrptivity coefficient sufficient to provide an antireflective effect at a thickness equal to or more than 200 nm and a high etching resistance as demonstrated by an etching rate with $CF_4/CHF_3$ gas and $Cl_2/BCl_3$ gas which is slower than conventional m-cresol novolak resins. The resist shape after patterning is satisfactory.

BREIF DESCRIPTION OF THE DRAWINGS

DESCRIPTION OF THE PREFERRED EMBODIMENTS

Figure 1:
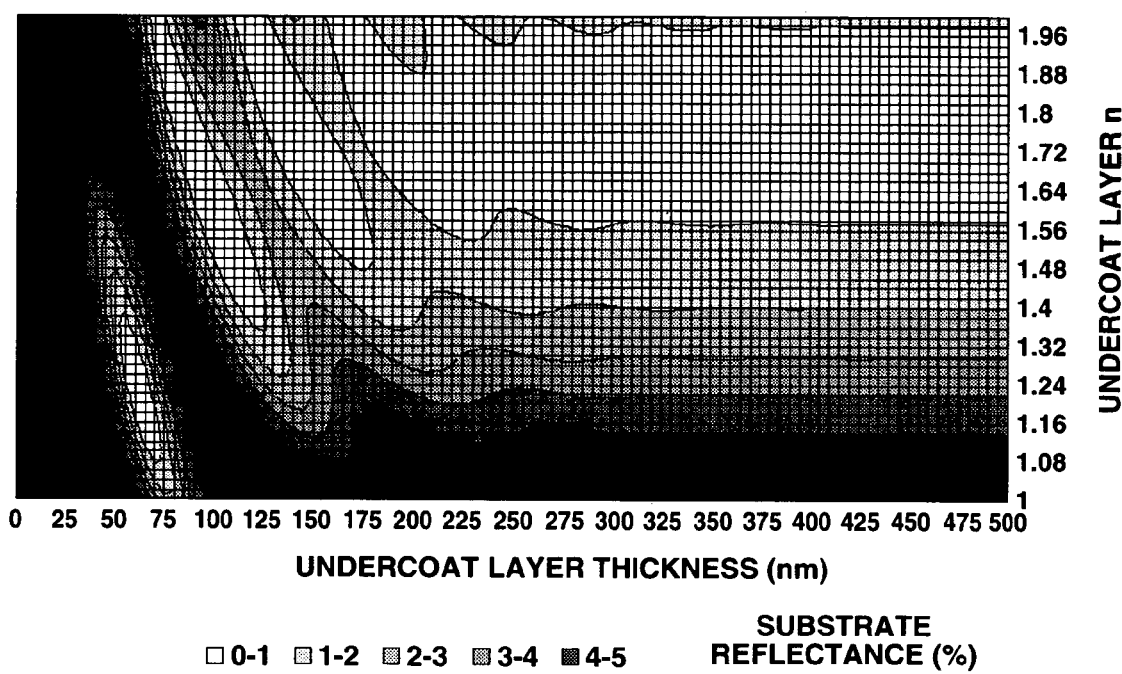
FIG. 1 is a graph plotting the substrate reflectance versus undercoat layer thickness in bilayer process when the k value of the undercoat layer is fixed at 0.3 and the n value varies from 1.0 to 2.0.
Figure 2:
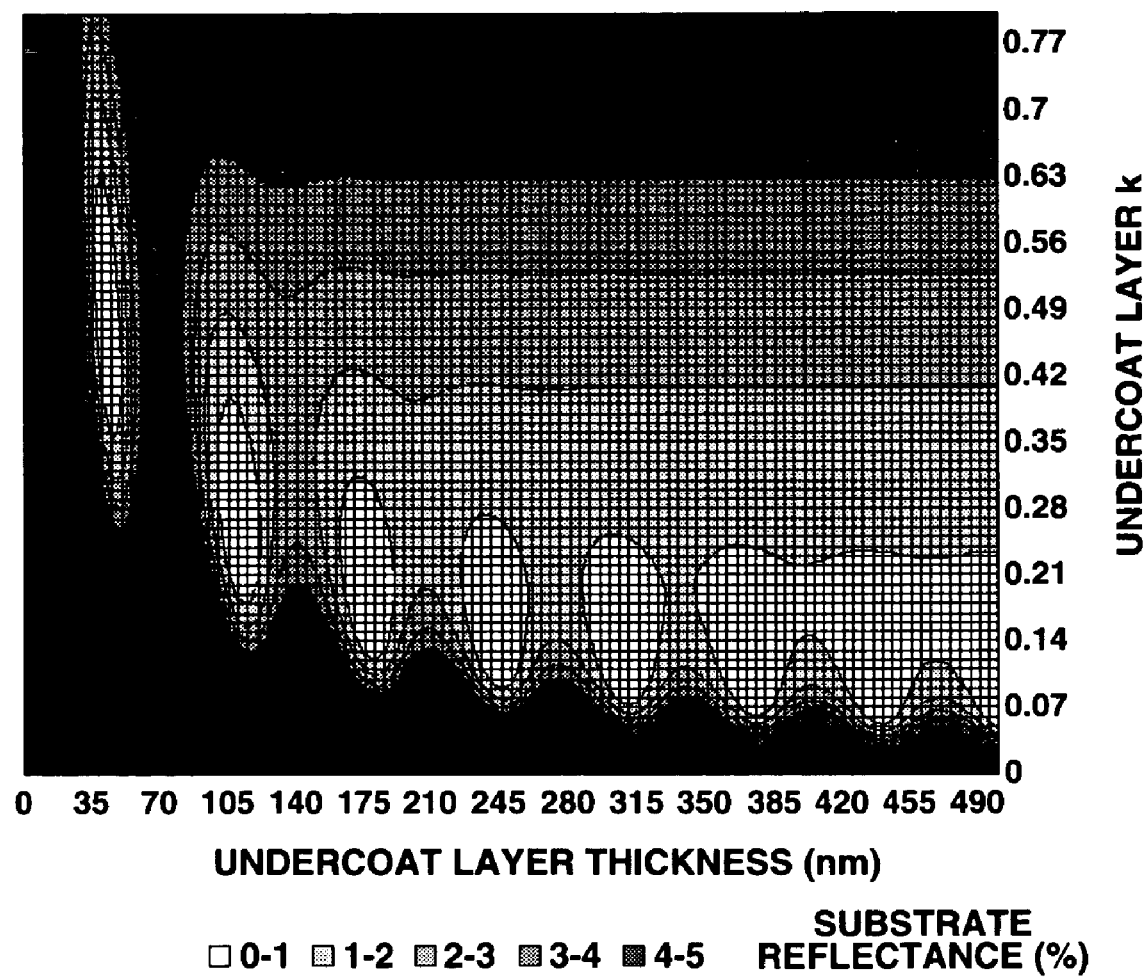
FIG. 2 is a graph plotting the substrate reflectance versus undercoat layer thickness in bilayer process when the n value of the undercoat layer is fixed at 1.5 and the k value varies from 0.1 to 1.0.
Figure 3:
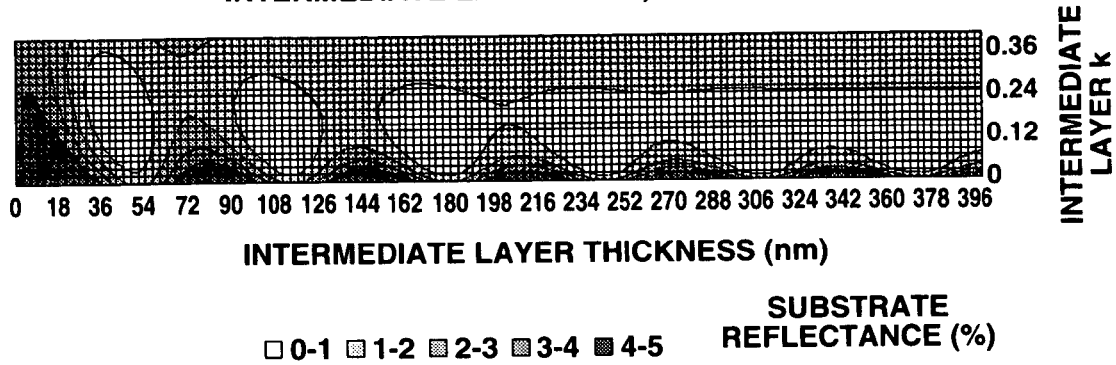
FIG. 3 is a graph plotting the substrate reflectance in trilayer process when the undercoat layer has a fixed n of 1.5, a fixed k of 0.6 and a fixed thickness of 500 nm, and the intermediate layer has a fixed n of 1.5, a k value varying from 0 to 0.3 and a thickness varying from 0 to 400 nm.
Figure 4:
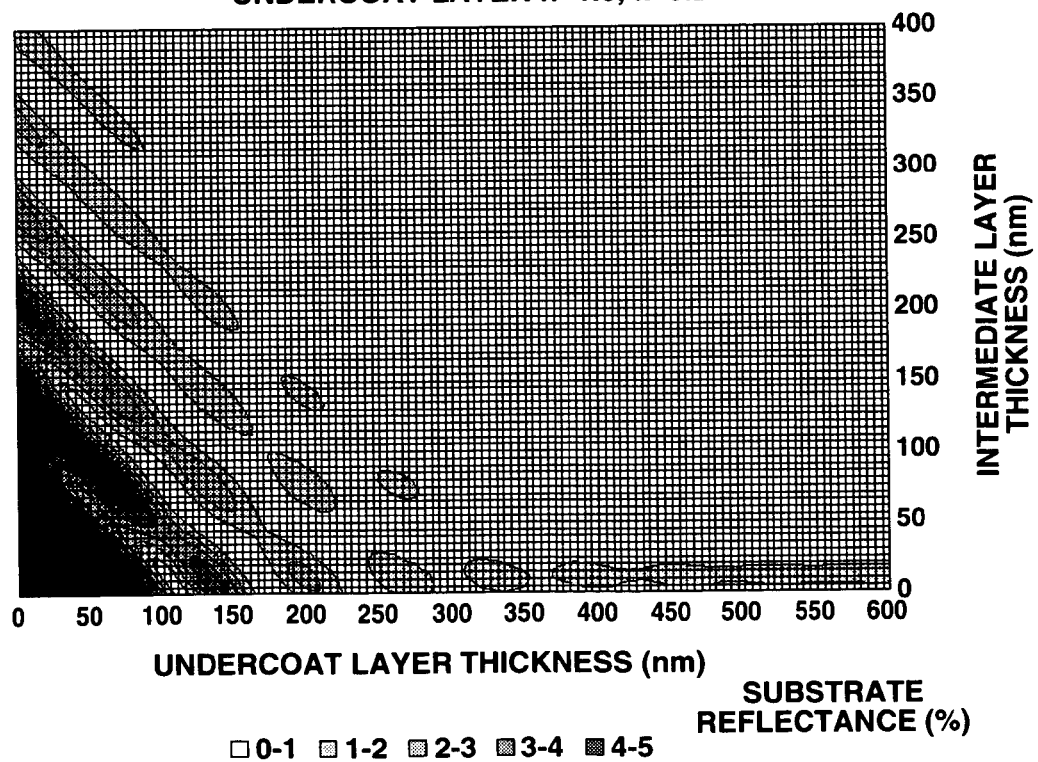
FIG. 4 is a graph plotting the substrate reflectance versus varying thickness of the undercoat layer and layer has a fixed in trilayer process when the undercoat layer has a fixed n of 1.5 and a fixed k of 0.2, and the intermediate layer has a fixed n of 1.5 and a fixed k of 0.1.
Figure 5:
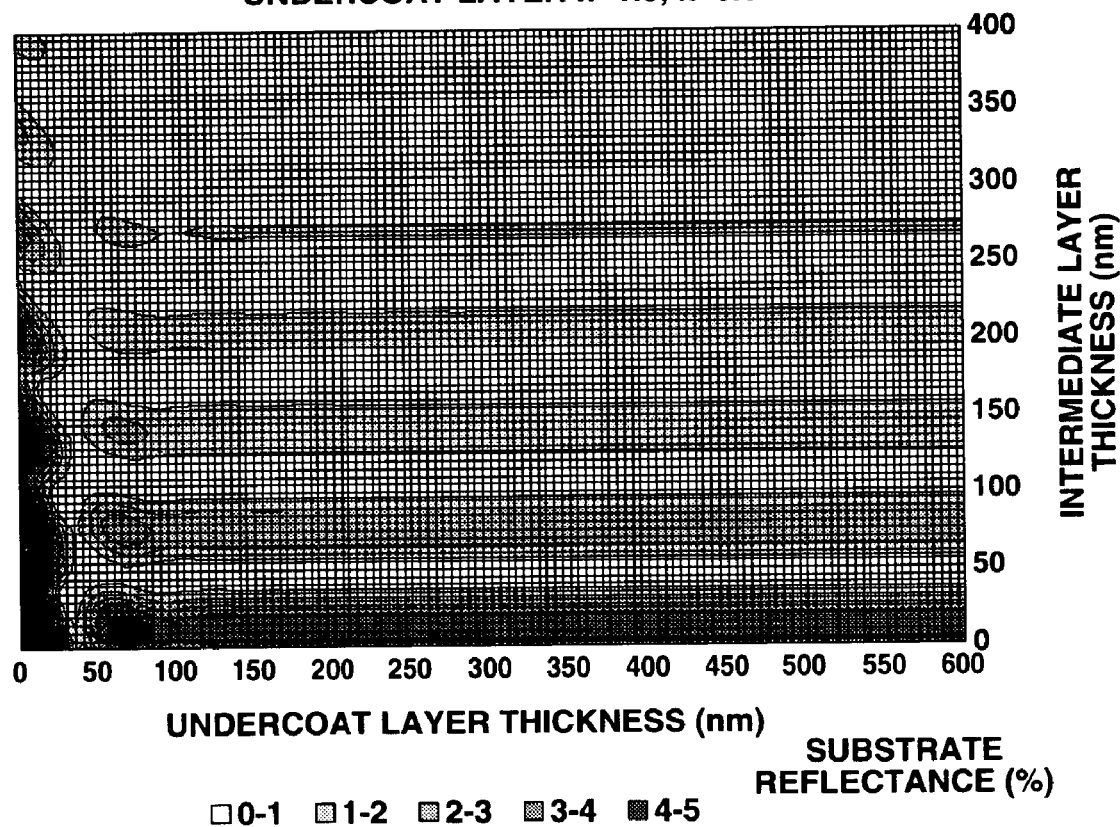
FIG. 5 is a graph plotting the substrate reflectance versus varying thickness of the undercoat layer and intermediate layer in trilayer process when the undercoat layer has a fixed n of 1.5 and a fixed k of 0.6, and the intermediate layer has a fixed n of 1.5 and a fixed k of 0.1.

The patterning process of the invention involves the steps of applying a photoresist undercoat-forming material comprising a novolak resin having a fluorene or tetrahydrospiro-biindene structure as a base resin onto a substrate to form a photoresist undercoat layer, applying a layer of a photoresist composition over the undercoat layerm, optionally with an intermediate layer interposed therebetween, exposing the photoresist layer in a predetermined region to radiation, developing the photoresist layer with a developer to form a resist pattern, and processing the undercoat layer and the substrate through the patterned photoresist layer as a maks, by means of a dry etching apparatus. The undercoat-forming material used herein comprises essentially (a) a novolak resin having a fluorene or tetrahydrospirobiindene structure as a base resin, and optionally and preferably (b) an organic solvent, (c) a crosslinker, and (c) an acid generator.

Resin

In a preferred embodiment, the novolak resing having a fluorene or tetrahydrospirobiindene structure comprises recurring units of the general fomrula (1a) or (1b).

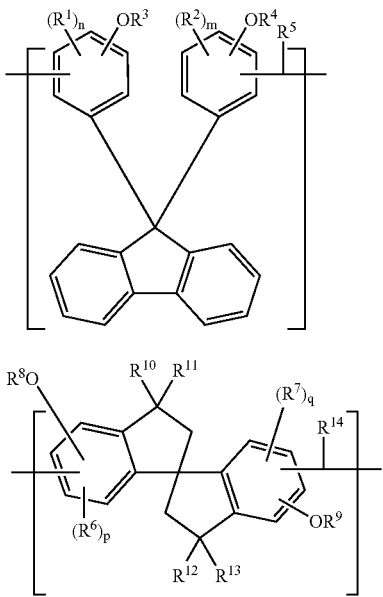

(1a)

(1b)

Herein $R^1$, $R^2$, $R^6$ and $R^7$ are each independently hydrogen, a straight, branched or cyclic $C_1$-$C_{10}$ alkyl group, a $C_6$-$C_{10}$ aryl group, allyl or halogen atom; $R^3$, $R^4$, $R^8$ and $R^9$ are each independently hydrogen, a straight, branched or cyclic $C_1$-$C_6$ alkyl group, a straight, branched or cyclic $C_2$-$C_6$ alkenyl group, a $C_6$-$C_{10}$ aryl group or a glycidyl group; $R^5$ and $R^{14}$ are each independently hydrogen, a straight, branched or cyclic $C_1$-$C_{10}$ alkyl group or a $C_6$-$C_{10}$ aryl group; n, m, p and q are each an integer of 1 to 3; $R^{10}$ to $R^{13}$ are each independently hydrogen, halogen, hydroxyl, a straight, branched or cyclic $C_1$-$C_6$ alkyl group or a straight, branched or cyclic $C_1$-$C_6$ alkoxy group.

Suitable alkyl groups include methyl, ethyl, propyl, isopropyl, butyl, isobutyl, tert-butyl, pentyl, cyclopentyl, hexyl, cyclohexyl, octyl and decyl. Suitable aryl groups include phenyl, xylyl, tolyl and naphthyl. Suitable alkenyl groups include vinyl, allyl, propenyl, butenyl, hexenyl and cyclohexenyl. Suitable alkoxy groups include methoxy, ethoxy, propoxy, butoxy, tert-butoxy, hexyloxy and cyclohexyloxy. Suitable halogen atoms include F, Cl and Br.

Suitable phenols (A) from which recurring units having a fluorene structure of formula (1a) are derived include 4,4'-(9H-fluoren-9-ylidene)bisphenol, 2,2'-dimethyl-4,4'-(9H-fluoren-9-ylidene)bisphenol, 2,2'-diallyl-4,4'-(9H-fluoren-9-ylidene)bisphenol, 2,2'-difluoro-4,4'-(9H-fluoren-9-ylidene)bisphenol, 2,2'-diphenyl-4,4'-(9H-fluoren-9-ylidene)bisphenol, and 2,2'-dimethoxy-4,4'-(9H-fluoren-9-ylidene)bisphenol.

Suitable phenols (B) from which recurring units having a tetrahydrospirobiindene structure of formula (1b) are derived include 2,3,2',3'-tetrahydro-(1,1')-spirobiindene-6,6'-diol, 3,3,3',3'-tetramethyl-2,3,2',3'-tetrahydro-(1,1')-spirobiindene-6,6'-diol, 3,3,3',3',4,4'-hexamethyl-2,3,2',3'-tetrahydro-(1,1')-spirobiindene-6,6'-diol, 2,3,2',3'-tetrahydro-(1,1')-spirobiindene-5,5'-diol, and 5,5'-dimethyl-3,3,3',3'-tetramethyl-2,3,2',3'-tetrahydro-(1,1')spirobiindene-6,6'-diol.

A phenol having a fluorene or tetrahydrospirobiindene structure as listed above may be polymerized alone or copolymerized with another phenol.

Suitable copolymerizable phenols (C) include phenol, o-cresol, m-cresol, p-cresol, 2,3-dimethylphenol, 2,5-dimethylphenol, 3,4-dimethylphenol, 3,5-dimethylphenol, 2,4-dimethylphenol, 2,6-dimethylphenol, 2,3,5-trimethylphenol, 3,4,5-trimethylphenol, 2-t-butylphenol, 3-t-butylphenol, 4-t-butylphenol, 2-phenylphenol, 3-phenylphenol, 4-phenylphenol, 3,5-diphenylphenol, 2-naphthylphenol, 3-naphthylphenol, 4-naphthylphenol, 4-tritylphenol, resorcinol, 2-methylresorcinol, 4-methylresorcinol, 5-methylresorcinol, catechol, 4-t-butylcatechol, 2-methoxyphenol, 3-methoxyphenol, 2-propylphenol, 3-propylphenol, 4-propylphenol, 2-isopropylphenol, 3-isopropylphenol, 4-isopropylphenol, 2-methoxy-5-methylphenol, 2-t-butyl-5-methylphenol, pyrogallol, thymol, isothymol, etc.

Besides, any copolymerizable monomer may be copolymerized. Suitable monomers (D) include 1-naphthol, 2-naphthol, 2-methyl-1-naphthol, 4-methoxy-1-naphthol, 7-methoxy-2-naphthol; dihydroxynaphthalenes such as 1,5-dihydroxynaphthalene; 1,7-dihydroxynaphthalene, and 2,6-dihydroxynaphthalene; methyl 3-hydroxy-naphthalene-2-carboxylate, indene, hydroxyindene, benzofuran, hydroxyanthracene, acenaphthylene, biphenyl, bisphenol, trisphenol, dicyclopentadiene, tetrahydroindene, 4-vinylcyclohexene, norbornadiene, 5-vinylnorborn-2-ene, α-pinene, β-pinene, limonene, etc. Copolymers of three or more monomers including a monomer (D) are included.

To produce novolak resins from the foregoing phenols, condensation reaction with aldehydes is utilized.

The phenol (A) and/or (B), additional phenol (C), and copolymerizable monomer (D) are preferably combined in such proportion as to meet a molar ratio:

[A+B]/[A+B+C+D]=0.1 to 1.0, epsecially 0.15 to 1.0,

[C]/[A+B+C+D]=0 to 0.9, especially 0 to 0.85, and

[D]/[A+B+C+D]=0 to 0.8, especially 0 to 0.7.

Typically phenol (A) and phenol (B) are separately used although a mixture of phenols (A) and (B) in any suitable proportion may be used if desired.

Suitable aldehydes include formaldehyde, trioxane, paraformaldehyde, benzaldehyde, actealdehyde, propylaldehyde, phenylacetaldehyde, α-phenylpropylaldehyde, β-phenylpropylaldehyde, o-hydroxybenzaldehyde, m-hydroxybenzaldehyde, p-hydroxybenzaldehyde, o-chlorobenzaldehyde, m-chlorobenzaldehyde, p-chlorobenzaldehyde, o-nitrobenzaldehyde, m-nitrobenzaldehyde, p-nitrobenzaldehyde, o-methylbenzaldehyde, m-methylbenzaldehyde, p-methylbenzaldehyde, p-ethylbenzaldehyde, p-n-butylbenzaldehyde, furfural, etc. Of these, formaldehyde is most preferred. The aldehydes may be used along or in admixture or any.

An appropriate amount of the aldehyde used is 0.2 to 5 moles, more preferably 0.5 to 2 moles per mole of the phenols.

Catalysts may be used in the condensation reaction of phenols with aldehydes. Suitable catalysts include acidic catalysts such as hydrochloric acid, nitric acid, sulfuric acid, formic acid, oxalic acid, acetic acid, methanesulfonic acid, camphorsulfonic acid, tosylic acid, and trifluoromethanesulfonic acid. An appropriate amount of the acidic catalyst used is in the range of $1\times10^{-5}$ to $5\times10^{-1}$ mole per mole of the phenols.

The aldehyde need not necessarily be used in the event of copolymerization with compounds having a non-conjugated double bond such as idene, hydroxyindene, benzofuran, hydroxyanthracene, acenaphthylene, biphenyl, bisphenol, trisphenol, dicyclopentadiene, tetrahydroindene, 4-vinylcyclohexene, norbornadiene, 5-vinylnorborn-2-ene, α-pinene, β-pinene, and limonene.

For polycondensation, a solvent such as water, methanol, ethanol, propanol, butanol, tetrahydrofuran, dioxane or a mixture of any may be used. Typically the solvent is used in an amount of 0 to 2,000 parts by weight per 100 parts by weight of the reactants. The reaction temperature may be selected as appropriate depending on the reactivity of reactants used although it is typically in the range of 10 to 200° C.

The condensation reaction may be carried out by any desired mode, for example, by charging the reactor with the phenols, aldehyde and catalyst together or by adding dropwise the phenols and aldehyde in the presence of the catalyst.

After the completion of polycondensation reaction, the unreacted reactants catalyst and the like in the system are removed. Specifically, the volatiles can be distilled off by heating the reactor at 130 to 230° C. under a pressure of about 1 to 50 mmHg.

The novolak resin preferably has a weight average molecular weight (Mw) in the range of about 2,000 to about 30,000, more preferably about 3,000 to about 20,000, based on polystyrene standards. Its molecular weight distribution or dispersity (Mw/Mn) is preferably in the range of 1.2 to 7. A narrow dispersity which is arrived at by cutting off monomer components, oligomeric components or low molecular weight components having a Mw of not more than 1,000 offers benefits of more efficient crosslinking and reduced amounts of volatile components during baking, preventing contamination around the baking cup.

The novolak resin as condensed can then be modified by introducing a fused aromatic or cycloaliphatic substituent group into the novalak resin phenol at the ortho or para position in the presence of an acidic catalyst. Examples of the substituent group which can be introduced are given below.

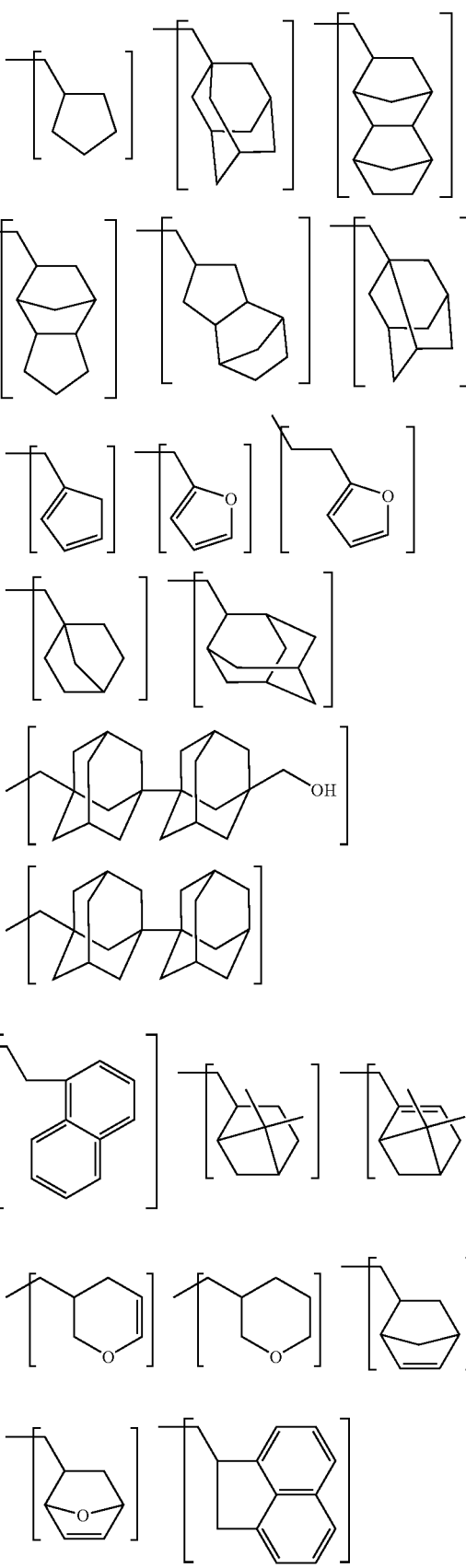

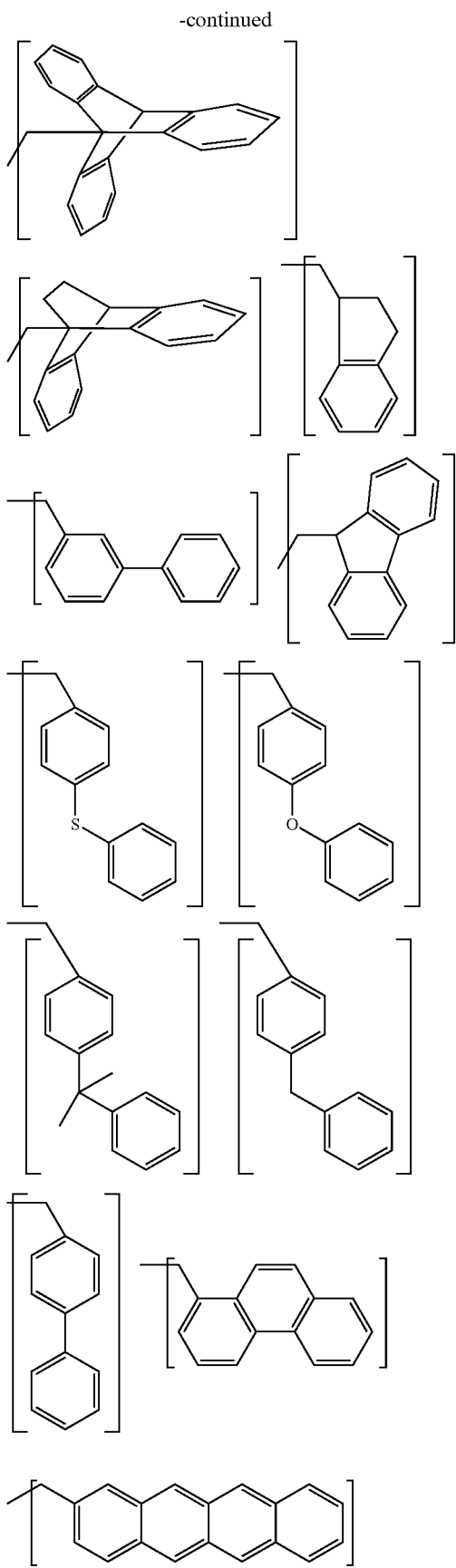

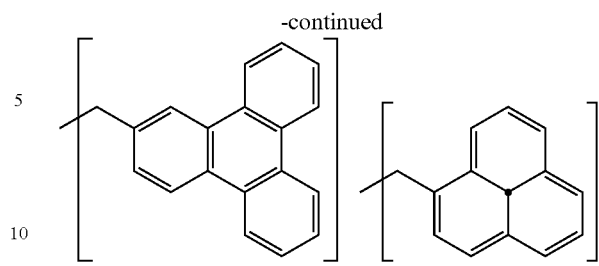

Of these, polycyclic aromatic groups such as anthracenemethyl and pyrenemethyl are most preferred for 248-nm exposure. For improved transparency at 193 nm, groups having a cycloaliphatic or naphthalene structure are preferred. In this regard, since the benzene ring has a window of improved transparency at wavelength 157 nm, the absorption wavelength must be shifted to increase absorption. The furan ring as absorption at a shorter wavelength than the benzene ring, and is somewhat improved in absorption oat wavelength 157 nm, but its effect is less. The naphthalene, anthracene and pyrene rings have longer absorption wavelengths and exhibit increased absorption. Due to the additional benefit of improved etching resistance, these aromatic rings are preferably used.

One examplary method of introducing substituent groups is by introducing an alcohol compound in which the bond position of the substituent group is a hydroxyl group, into a phenol at the ortho or para-position relative to the hydroxyl group in the presence of an acid catalyst. Suitable acid catalysts are acidic catalysts including hydrochloric acid, nitric acid, sulfuric acid, formic acid, oxalic acid, acetic acid, methanesulfonic acid, n-butanesulfonic acid, camphorsulfonic acid, tosylic acid, and trifluoromethanesulfonic acid. The acidic catalyst is used in an amount of $1\times10^{-5}$ to $5\times10^{-1}$ mole per mole of phenols. The amount of substituent groups introduced is in the range of 0 to 0.8 mole per mole of phenolic hydroxyl groups.

If desired, the inventive novolak resin of formula (1a) or (1b) can be hydrogenated to further improve its transparency at 193 nm. The degree of hydrogenation is preferably up to 80 mol %, more preferably up to 60 mol % of the aromatic groups.

The base resin of the undercoat-forming material of the invention is characterized by the inclusion of the novolak resin having fluorene or spirobiindene structure although the resin can be blended with any of conventional polymers which are used in the art as the antireflective film-forming material. The novolak resin having fluorene or spirobiindene structure with a molecular weight (Mw) of 5,000 has a glass transition temperature (Tg) of at least 150° C., and when used alone, it sometimes ineffective in filling deep holes such as via holes. One effective approach of filling holes with a resin without leaving voids is by using a polymer having a low Tg, heating the polymer at a temperature below the crosslinking temperature to provide a heat flow, and filling holes to the bottom (see U.S. Pat. No. 6,316,165 or JP-A 2000-294504). The novolak resin having fluorene or spirobiindene structure may be blended with polymers having a low Tg, typically a Tg below 180° C., especially a Tg of 100 to 170° C., for example, polymers resulting from polymerization of one or more monomers selected from among styrene, hydroxystyrene, acrylic derivatives, vinyl alcohol, vinyl ethers, allyl ethers, styrene derivatives, allyl benzene derivatives, olefins such as ethylene, propylene and butadiene, and polymers obtained by metathesis ring-opening polymerization, to form a blend having a lower Tg and improved via hole filling performance. The above-mentioned introduction of the fused aromatic or cycloaliphatic substituent groups as pendants has the benefit of lower Tg than ordinary novolak resins. The Tg can be lowered by 10 to 50° C. although such a Tg lowering depends on the type and proportion of substituent groups introduced as pendants.

Another Tg lowering method is to substitute straight, branched or cyclic $C_1$-$C_{20}$ alkyl groups (e.g., t-butyl, t-amyl), acid labile groups (e.g., acetal), acetyl or pivaloyl groups for hydroxyl groups on the novolak resin of formula (1a) or (1b). The degree of substitution is preferably in a range of 10 to 80 mol %, more preferably 15 to 70 mol % based on the hydroxyl groups on the novolak resin.

One of the functions required for the undercoat layer including an antireflective film is the elimination of intermixing with the resist and the elimination of diffusion of low molecular weight components into the resist layer (see Proc. SPIE Vol. 2195, pp. 225-229 (1994)). One common means for preventing intermixing and diffusion is by baking an antireflective film as spin coated for inducing thermal crosslinkage. Then, in the event the antireflective film material contains a crosslinker, a method of introducing crosslinkable substituent groups into the polymer may be employed.

Crosslinker

Examples of the crosslinker which can be used herein include melamine compounds, guanamine compounds, glycoluril compounds and urea compounds hving substituted thereon at least one group selected from among methylol, alkoxymethyl and acyloxymethyl groups, epoxy compounds, thioepoxy compounds, isocyanate compounds, azide compounds, and compounds having a double bond such as an alkenyl ether group. These compounds may be used as an additive or introduced as pendant gorups on polymer side chains, Compounds having a hydroxy group are also useful as the crosslinker.

Of the foregoing compounds, examples of suitable epoxy compounds include tris(2,3-epoxypropyl)isocyanurate, trimethylolmethane, triglycidyl ether, trimethylolpropane triglycidyl ether, and triethylolethane triglycidyl ether. Examples of the melamine compound include hexamethylol melamine, hexamtheoxymethyl melamine, hexamethylol melamine compounds having 1 to 6 methylol groups methoxymethylated and mixtures thereof, hexamethoxyethyl melamine, hexaacyloxymethyl melamine, hexamethylol melamine compounds having 1 to 6 methylol groups acyloxymethylated and mixtures thereof. Examples of the guanamine compound include tetramethylol guanamine, tetramethoxymethyl guanamine, tetramethylol guanamine compounds having 1 to 4 methylol groups methoxymethylated and mixtures thereof, tetramethoxyethyl guanamine, tetraacyloxyguanamine, tetramethylol guanamine compounds having 1 to 4 methylol groups acyloxymethylated and mixtures thereof. Examples of the glycoluril compounds include tetramethylol glycoluril, tetramethoxyglycoluril, tetramethoxymethyl glycoluril, tetramethylol glycoluril compounds having 1 to 4 methylol groups methoxymethylated and mixtures thereof, tetramethylol glycoluril compounds having 1 to 4 methylol groups acyloxymethylated and mixtures thereof. Examples of the urea compound include tetramethylol urea, tetramethyoxymethyl urea, tetramethylol urea compounds having 1 to 4 methylol groups methoxymethylated and mixtures thereof, and tetramethoxyethyl urea.

Examples of the alkenyl ether group-containing compound include ethylene glycol divinyl ether, triethylene glycol divinyl ether, 1,2-propanediol divinyl ether, 1,4-butanediol divinyl ether, tetramethylene glycol divinyl ether, neopentyl glycol divinyl ether, trimethylol propane trivinyl ether, hexanediol divinyl ether, 1,4-cyclohexanediol divinyl ether, pentaerythritol trivinyl ether, pentaerythritol tetravinyl ether, sorbitol tetravinyl ether, sorbitol pentavinyl ether, and trimethylol propane trivinyl ether.

Where hydrogen atoms of hydroxyl groups on the novolak resin having a fluorene or spirobiindene structure of formula (1a) or (1b) are substituted with glycidyl groups, the addition of a compound having a hydroxyl group or a hydroxyl group whose hydrogen atom is substituted with a glycidyl group is effective. Compounds having at least two hydroxyl or glycidyloxy groups in a molecule are more preferred.

Examples include alcoholic group-containing compounds such as naphthol novolak, m- and p-cresol novolak, naphthol-dicyclopentadiene novolak, m- and p-cresol-dicyclopentadiene novolak, 4,8-bis(hydroxymethyl)tricyclo[5.2.1.0$^{2.6}$]-decane, pentaerythritol, 1,2,6-hexanetriol, 4,4',4''-methylidene triscyclohexanol, 4,4'-[1-[4-[1-(4-hydroxycyclohexyl)-1-methylethyl]phenyl]- ethylidene]biscyclohexanol, [1,1'-bicyclohexyl]-4,4'-diol, methylenebiscyclohexanol, decahydronaphthalene-2,6-diol, and [1,1'-bicyclohexyl]-3,3',4,4'-tetrahydroxy; and low-nuclear phenol compounds such as bisphenol, methylene bisphenol, 2,2'-methylenebis[4-methylphenol], 4,4'-methylidene-bis [2,6-dimethylphenol], 4,4'-(1-methyl-ethylidene)bis[2-methylphenol], 4,4'-cyclohexylidene bisphenol, 4,4'-(1,3-dimethylbutylidene) bisphenol, 4,4'-(1-methylethylidene)bis[2,6-dimethylphenol], 4,4'-oxybisphenol, 4,4'-methylenebisphenol, bis(4-hydroxyphenyl)methanone, 4,4'-methylene bis[2-methylphenol], 4,4'-[1,4-phenylenebis(1-methylethylidene)]bisphenol, 4,4'-(1,2-ethanediyl) bisphenol, 4,4'-(diethylsilylene)bisphenol, 4,4'-[2,2,2-trifluoro-1-(trifluoromethyl)ethylidene]bisphenol, 4,4',4''-methylidene trisphenol, 4,4'-[1-(4-hydroxyphenyl)-1-methylethyl]phenyl]ethylidene]- bisphenol, 2,6-bis[(2-hydroxy-5-methylphenyl)methyl]-4-methylphenol, 4,4',4''-ethylidyne tris[2-methylphenol], 4,4',4''-ethylidyne trisphenol, 4,6-bis[(4-hydroxyphenyl)methyl]-1,3-benzenediol, 4,4'-[(3,4-dihydroxyphenyl)methylene]bis[2-methylphenol], 4,4',4'',4'''-(1,2-ethanediylidene)tetrakisphenol, 4,4',4'',4'''-(1,2-ethanediylidene)tetrakis[2-methylphenol], 2,2'-methylenebis[6-[(2-hydroxy-5-methylphenyl)methyl]-4- methylphenol], 4,4',4'',4'''-(1,4-phenylenedimethylidyne) tetrakisphenol, 2,4,6-tris(4-hydroxyphenylmethyl)-1,3-benzenediol, 2,4',4''-methylidenetrisphenol, 4,4',4'''-(3-methyl-1-propanyl-3-ylidene)trisphenol, 2,6-bis[(4-hydroxy-3-fluorophenyl)methyl]-4-fluorophenol, 2,6-bis[4-hydroxy-3-fluorophenyl]methyl]-4-fluorophenol, 3,6-bis[(3,5-dimethyl-4-hydroxyphenyl)methyl]-1,2-benzenediol, 4,6-bis[(3,5-dimethyl-4-hydroxyphenyl)methyl]-1,3-benzenediol, p-methylcalix[4]arene, 2,2'-methylenebis[6-[(2,5/3,6-dimethyl-4/2-hydroxyphenyl)- methyl]-4-methylphenol, 2,2'-methylenebis[6-[(3,5-dimethyl-4-hydroxyphenyl)methyl]-4- methylphenol, 4,4',4'',4'''-tetrakis[(1-methylethylidene)bis(1,4-cyclo- hexylidene)] phenol, 6,6'-methylenebis[4-(4-hydroxyphenylmethyl)1,2,3-benzenetriol, and 3,3',5,5'-tetraks[(5-methyl-2-hydroxyphenyl)methyl]- [(1,1'-biphenyl)-4,4'-diol], and modified forms of the foregoing compounds in which a hydroxyl group is modified into glycidyl ether.

In the inventive undercoat-forming material, the crosslinker is preferably compounded in an amount of 5 to 50 parts by weight, more preferably 10 to 40 parts by weight per 100 parts by weight of the base polymer (entire resin). Less than 5 pbw of the crosslinker may allow for mixing with the resist. More than 5 pbw of the crosslinker may degrade the antireflection effect or allow the crosslinked film to crack.

Acid generator

In the practice of the invention, an acid generator may be added to accelerate the thermally induced crosslinking reaction. Acid generators include those which generate an acid through pyrolysis and those which generate an acid upon exposure to light, and both are useful.

The acid generators used herein include (i) onium salts of the formula (Pla-1), (Plas-2), (Plas-3) or (Plb), (ii) diazomethane derivatives of the formula (P2), (iii) glyoxime derivatives of the formula (P3), (iv) bissulfone derivatives of the formula (P4), (v) sulfonic acid esters of N-hydroxyimide compounds of the formula (P5), (vi) β-ketosulfonic acid derivatives, (vii) disulfone derivatives, (viii) nitrobenzylsulfonate derivatives, and (ix) sulfonate derivatives.

These acid generators are described in detail.

(i) Onium salts of formula (Pla-1), (Pla-2) or (Pla-3):

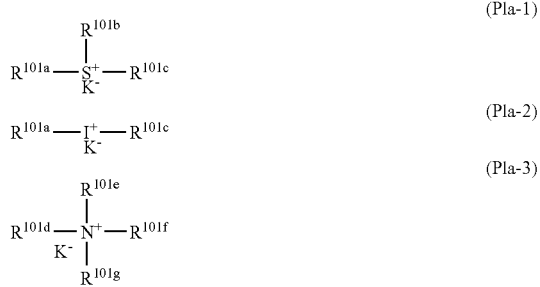

Herein, $R^{101a}$, $R^{101b}$, and $R^{101c}$ independently represent straight, branched or cyclic alkyl, alkenyl, oxoalkyl or oxoalkenyl groups of 1 to 12 carbon atoms, aryl groups of 6 to 20 carbon atoms, or aralkyl or aryloxoalkyl groups of 7 to 12 carbon atoms, wherein some or all of the hydrogen atoms may be replaced by alkoxy or other groups. Also, $R^{101b}$ and $R^{101c}$, taken together, may form a ring. $R^{101b}$ and $R^{101c}$ each are alkylene groups of 1 to 6 carbon atoms when they form a ring. $K^-$ is a non-nucleophilic counter ion. $R^{101d}$, $R^{101e}$, $R^{101f}$, and $R^{101g}$ stand for the same as $R^{101a}$, $R^{101b}$, and $R^{101c}$ as well as hydrogen atoms. A pair of $R^{101d}$ and $R^{101e}$ or a combination of $R^{101d}$, $R^{101e}$ and $R^{101f}$ may form a ring, and each of $R^{101d}$ and $R^{101e}$ or each of $R^{101d}$, $R^{101e}$ and $R^{101f}$ is an alkylene group of 3 to 10 carbon atoms when they form a ring. $R^{101d}$, $R^{101e}$, $R^{101f}$, and $R^{101g}$, taken together, may stand for a heterocyclic aromatic ring having the nitrogen atom (in the formula) incorporated therein.

$R^{101a}$, $R^{101b}$, $R^{101c}$, $R^{101d}$, $R^{101e}$, $R^{101f}$, and $R^{101g}$ may be the same or different and are illustrated below. Exemplary alkyl groups include methyl, ethyl, propyl, isopropyl, n-butyl, sec-butyl, tert-butyl, pentyl, hexyl, heptyl, octyl, cyclopenyl, cyclohexyl, cyclohexyl, cyclopropylmethyl, 4-methylcyclohexyl, cyclohexylmethyl, norbornyl, and adamantyl. Exemplary alkenyl groups include vinyl, allyl, propenyl, butenyl, hexenyl, and cyclohexenyl. Exemplary oxoalkyl groups include 2-oxocyclopenyl and 2-oxocyclohexyl as well as 2-oxopropyl, 2-cyclopentyl-2-oxoethyl, 2-cyclohexyl-2-oxoethyl, and 2-(4-methylcyclohexyl)-2-oxoethyl. Exemplary aryl groups include phenyl and naphthyl; alkoxyphenyl groups such as p-methoxyphenyl, m-methoxyphenyl, o-methyoxyphenyl, ethoxyphenyl, p-tert-butoxyphenyl, and m-tert-butoxyphenyl; alkylphenyl groups such as 2-methylphenyl, 3-methylphenyl, 4-methylphenyl, ethylphenyl, 4-tert-butylphenyl, 4-butylphenyl, and dimethylphenyl; alkylnaphthyl groups such as methylnaphthyl and ethylnaphthyl; alkoxynaphthyl groups such as methoxynaphthyl and ethoxynaphthyl; dialkylnaphthyl groups such as dimethylnaphthyl and diethylnaphthyl; and dialkoxynaphthyl groups such as dimethoxynaphthyl and diethoxynaphthyl. Exemplary aralkyl groups include benzyl, phenylethyl, and phenethyl. Exemplary aryloxoalkyl groups are 2-aryl-2-oxoethyl groups such as 2-phenyl-2-oxoethyl, 2-(1-naphthyl)-2-oxoethyl, and 2-(2-naphthyl)-2-oxoethyl. Examples of the non-nucleophilic counter ion represented by $K^-$ include halide ions such as chloride and bromide ions, fluoroalkylsulfonate ions such as triflate, 1,1,1-trifluoroethanesulfonate, and nonafluorobutanesulfonate, arylsulfonate ions such as tosylate, benzenesulfonate, 4-fluorobenzenesulfonate, and 1,2,3,4,5-pentafluorobenzenesulfonate, and alkylsulfonate ions such as mesylate and butanesulfonate.

Examples of the heterocyclic aromatic ring having the nitrogen atom (in formula (Pla-3)) incorporated therein, represented by $R^{101d}$, $R^{101e}$, $R^{101f}$, and $R^{101g}$ include imidazole derivatives (e.g., imidazole, 4-methylimidazole, and 4-methyl-2-phenylimidazole), pyrazole derivatives, furazan derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyrdine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, domethoxypyridine, 1-methyl-2-pyridone, 4-pyrrolidinopyridine, 1-methyl-4-phenylpyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperdine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, qinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

The salts of (Pla-1) and (Pla-2) have both the functions of a photoacid generator and a thermal acid generator while the salts of (Pla-3) function as a thermal acid generator.

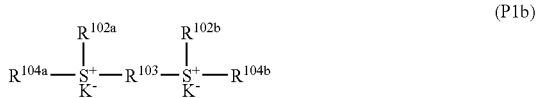

(P1b)

Herein, $R^{102a}$ and $R^{102b}$ independently represent straight, branched or cyclic alkyl groups of 1 to 8 carbon atoms. $R^{103}$ to 10 carbon atoms. $R^{104a}$ and $R^{104b}$ independently represent non-nucleophilic counter ion.

Illustrative of the groups represented by $R^{102a}$ and $R^{102b}$ are methyl, ethyl, propyl, isopropyl, n-butyl, sec-butyl, tert-butyl, pentyl, hexyl, heptyl, octyl, cyclopentyl, cyclohexyl, cyclopropylmethyl, 4-methylcyclohexyl, and cyclohexymethyl. Illustrative of the groups represented by $R^{103}$ are methylene, ethylene, propylene, butylene, pentylene, hexylene, heptylene, octylene, nonylene, 1,4-cyclohexylene, 1,2-cyclohexylene, 1,3-cyclopentylene, 1,4-cyclooctylene, and 1,4-cyclohexanedimethylene. Illustrative of the groups represented by $R^{104a}$ and $R^{104b}$ are 2-oxopropyl, 2-oxocyclopentyl, 2-oxocyclohexyl, and 2-oxocycloheptyl. Illustrative examples of the counter ion represented by $K^-$ are the same as exemplified for formulae (Pla-1), (Pla-2) and (Pla-3).

(ii) Diazomethane derivatives of formula (P2)

(P2)

Herein, Rhu 105 and $R^{106}$ independently represent straight, branched or cyclic alkyl or halogenated alkyl groups of 1 to 12 carbon atoms, aryl or halogenated aryl groups of 6 to 20 carbon atoms, or aralkyl groups of 7 to 12 carbon atoms.

Of the groups represented by $R^{105}$ and $R^{106}$, exemplary alkyl groups include methyl, ethyl, propyl, isopropyl, n-butyl sec-butyl, tert-butyl, pentyl, hexyl, heptyl, octyl, amyl, cyclopentyl, cyclohexyl, cycloheptyl, norbornyl, and adamantyl. Exemplary halogenated alkyl groups include trifluoromethyl, 1,1,1-trifluoroethyl, 1,1,1-trichloroethyl, and nonfluorobutyl. Exemplary aryl groups include phenyl; alkoxyphenyl groups such as p-methoxyphenyl, m-methoxyphenyl, o-methoxyphenyl, ethoxyphenyl, p-tert-butoxyphenyl, and m-tert-butoxyphenyl; and alkylphenyl groups such as 2-methylphenyl, 3-methylphenyl, 4-methylphenyl, ethylphenyl, 4-tert-butylphenyl, 4-butylphenyl, and dimethylphenyl. Exemplary halogenated aryl groups include fluorophenyl, chlorophenyl, and 1,2,3,4,5-pentafluorophenyl. Exemplary aralkyl groups include benzyl and phenethyl.

(iii) Glyoxime derivatives of formula (P3)

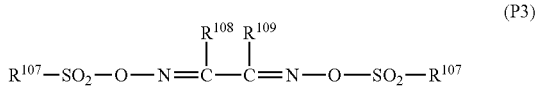

(P3)

Herein, $R^{107}$, $R^{108}$, and $R^{109}$ independently represent straight, branched or cyclic alkyl or halogenated alkyl groups of 1 to 12 carbon atoms, aryl or halogenated aryl groups of 6 to 20 carbon atoms, or aralkyl groups of 7 to 12 carbon atoms. Also, $R^{108}$ and $R^{109}$, taken together, may form a ring. $R^{108}$ and $R^{109}$ each are straight or branched alkylene groups of 1 to 6 carbon atoms when they form a ring.

Illustrative examples of the alkyl, halogenated alkyl, aryl, halogenated aryl, and aralkyl groups represented by $R^{107}$, $R^{108}$, and $R^{109}$ are the same as exemplified for $R^{105}$ and $R^{106}$. Examples of the alkylene groups represented by $R^{108}$ and $R^{109}$ include methylene, ethylene, propylene, butylene, and hexylene.

(iv) Bissulfone derivatives of formula (P4)

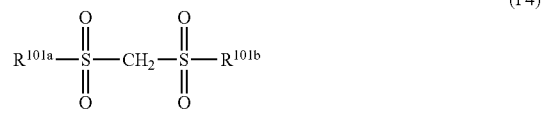

(P4)

Herein, $R^{101a}$ and $R^{101b}$ are as defined above.

(v) Sulfonic acid esters of N-hydroxyimide compounds of formula (P5)

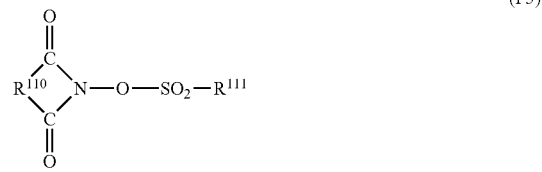

(P5)

Herein, $R^{110}$ is an arylene group of 6 to 10 carbon atoms, alkylene group of 1 to 6 carbon atoms, or alkenylene group of 2 to 6 carbon atoms wherein some or all of the hydrogen atoms may be replaced by straight or branched alkyl or alkoxy groups of 1 to 4 carbon atoms, nitro, acetyl, or phenyl groups. $R^{111}$ is a straight, branched or cyclic alkyl group of 1 to 8 carbon atoms, alkenyl, alkoxyalkyl, phenyl or naphthyl group wherein some or all of the hydrogen atoms may be replaced by alkyl or alkoxy groups of 1 to 4 carbon atoms, phenyl groups (which may have substituted thereon an alkyl or alkoxy of 1 to 4 carbon atoms, nitro, or acetyl group), hetero-aromatic groups of 3 to 5 carbon atoms, or chlorine or fluorine atoms.

Of the groups represented by $R^{110}$, exemplary arylene groups include 1,2-phenylene and 1,8-naphthylene; exemplary alkylene groups include methylene, ethylene, trimethylene, tetramethylene, phenylethylene, and norbornane-2,3-diyl; and exemplary alkenylene groups include 1,2-vinylene 1-phenyl-1,2-vinylene, and 5-norbornene-2,3-diyl. Of the groups represented by $R^{111}$, exemplary alkyl groups are as exemplified for $R^{101a}$ to $R^{101c}$; exemplary alkenyl groups include vinyl, 1-propenyl, allyl, 1-butenyl, 3-butenyl, isoprenyl, 1-pentenyl, 3-pentenyl, 4-pentenyl, dimethylallyl, 1-hexenyl, 3-hexenyl, 5-hexenyl, 1-heptenyl, 3-heptenyl, 6-heptenyl, and 7-octenyl; and exemplary alkoxyalkyl groups include methoxymethyl, ethoxymethyl, propoxymethyl, butoxymethyl, pentyloxymethyl, hexyloxymethyl, heptyloxymethyl, methoxyethyl, ethoxyethyl, propoxyethyl, butoxyethyl, pentyloxyethyl, hexyloxyethyl, methoxypropyl, ethoxypropyl, propoxypropyl, butoxypropyl, methoxybutyl, ethoxybutyl, propoxybutyl, methoxypentyl, ethoxypentyl, methoxyhexyl, and methoxyheptyl.

Of the substituents on these groups, the alkyl groups of 1 to 4 carbon atoms include methyl, ethyl, propyl, isopropyl, n-butyl, isobutyl and tert-butyl; the alkoxy groups of 1 to 4 carbon atoms include methoxy, ethoxy, propoxy, isopropoxy, n-butoxy, isobutoxy, and tert-butoxy; the phenyl groups which may have substituted thereon an alkyl or alkoxy of 1 to 4 carbon atoms, nitro, or acetyl group include phenyl, tolyl, p-tert-butoxyphenyl, p-acetylphenyl and p-nitrophenyl; the hetero-aromatic groups of 3 to 5 carbon atoms include pyridyl and furyl.

Illustrative examples of the acid generator include: onium salt such as tetramethylammonium trifluoromethansulfonate, tetramethylammonium nonafluorobutanesulftonate, triethylammonium nonafluorobutanesulfonate, pyridinium nonafluorobutanesulfonate, triethylammonium camphorsulfonate, pyridinium camphorsulfonate, tetra-n-butylammonium nonafluorobutanesulfonate, tetraphenylammonium nonafluorobutanesulfonate, tetramethylammonium p-toluenesulfonate, diphenyliodonium trifluoromethanesulfonate, (p-tert-butoxyphenyl)phenyliodonium trifluoromethanesulfonate, diphenyliodonium p-toluenesulfonate, (p-tert-butoxyphenyl)phenyliodonium p-toluenesulfonate, triphenylsulfonium trifluoromethanesulfonate, (p-tert-butoxyphenyl)diphenylsulfonium trifluoromethane-sulfonate, bis(p-tert-butoxyphenyl)penylsulfonium trifluormethane-sulfonate, tris(p-tert-butoxyphenyl)sulfonium trifluoromethane-sulfonate, triphenylsulfonium p-toluenesulfonate, (p-tert-butoxyphenyl)diphenylsulfonium p-toluenesulfonate, bis(p-tert-butoxyphenyl)phenylsulfonium p-toluenesulfonate, tris(p-tert-butoxyphenyl)sulfonium p-toluenesulfonate, triphenylsulfonium nonafluorobutanesulfonate, triphenylsulfonium butanesulfonate, trimethylsulfonium trifluoromethanesulfonate, trimethylsulfonium p-toluenesulfonate, cyclohexylmethyl(2-oxocyclohexyl)sulfonium trifluoromethane-sulfonate, cyclohexylmethyl(2-oxocyclohexy)sulfonium p-toluenesulfonate, dimethylphenylsulfonium trifluoromethanesulfonate, dimethylphenylsulfonium p-toluenesulfonate, dicyclohexylphenylsulfonium trifluoromethanesulfonate, dicyclohexylphenylsulfonium p-toluenesulfonate, trinaphthylsulfonium trifluoromethanesulfonate, cyclohexylmethyl(2-oxocyclohexyl)sulfonium trifluoromethanesulfonate, (2-norbornyl)methyl(2-oxocyclohexyl)sulfonium trifluoro-ethanesulfonate, ethylenebis[methyl(2-oxocyclopentyl)sulfonium trifluoromethanesulfonate], and 1,2'-naphthylcarbonylmethyltetrahydrothiophenium triflate; diazomethane derivatives such as bis(benzenesulfonyl)diazomethane, bis(p-toluenesulfonyl)diazomethane, bis(xylenesulfonyl)diazomethane, bis(cyclohexylsulfonyl)diazomethane, bis(cyclopentylsulfonyl)diazomethane, bis(n-butylsulfonyl)diazomethane, bis(isobutylsulfonyl)diazomethane, bis(sec-butylsulfonyl)diazomethane, bis(n-propylsulfonyl)diazomethane, bis(isopropylsulfonyl)diazomethane, bis(tert-butylsulfonyl)diazomethane, bis(n-amylsulfonyl)diazomethane, bis(isoamylsulfonyl)diazomethane, bis(sec-amylsulfonyl)diazomethane, bis(tert-amylsulfonyl)diazomethane, 1-cyclohexylsulfonyl-1-(tert-butylsulfonyl)diazomethane, 1-cyclohexylsulfonyl-1-(tert-amylsulfonyl)diazomethane; and 1-tert-amylsulfonyl-1-(tert-butylsulfonyl)diazomethane; glyoxime derivatives such as bis-O-(p-toluenesulfonyl)-α-dimethylglyoxime, bis-O-(p-toluenesulfonyl)-α-diphenylglyoxime, bis-O-(p-toluenesulfonyl)-α-dicyclohexylglyoxime, bis-O-(p-toluenesulfonyl)-2,3-pentanedioneglyoxime, bis-O-(p-toluenesulfonyl)-2-methyl-3,4-pentanedioneglyoxime, bis-O-(n-butanesulfonyl)-α-dimethylglyoxime, bis-O-(n-butanesulfonyl)-α-diphenylglyoxime, bis-O-(n-butanesulfonyl)-α-dicyclohexylglyoxime, bis-O-(n-butanesulfonyl)-2,3-pentanedioneglyoxime, bis-O-(n-butanesulfonyl)-2-methyl-3,4-pentanedioneglyoxime, bis-O-(methanesulfonyl)-α-dimethylglyoxime, bis-O-(trifluoromethanesulfonyl)-α-dimethylglyoxime, bis-O-(1,1,1-trifluoroethanesulfonyl)-α-dimethylglyoxime, bis-O-(tert-butanesulfonyl)-α-dimethylglyoxime, bis-O-(perfluorooctanesulfonyl)-α-dimethylglyoxime, bis-O-(cyclohexanesulfonyl)-α-dimethylglyoxime, bis-O-(benzenesulfonyl)-α-dimethylglyoxime, bis-O-(p-fluorobenzenesulfonyl)-α-dimethylglyoxime, bis-O-(p-tert-butylbenzenesulfonyl)-α-dimethylglyoxime, bis-O-(xylenesulfonyl)-α-dimethylglyoxime, and bis-O-(camphorsulfonyl)-α-dimethylglyoxime; bissulfone derivatives such as bisnaphthylsulfonylmethane, bistrifluoromethylsulfonylmethane, bismethylsulfonylmethane, bisethylsulfonylmethane, bispropylsulfonylmethane, bisisopropylsulfonylmethane, bis-p-toluenesulfonylmethane, and bisbenzenesulfonylmethane; β-ketosulfone derivatives such as 2-cyclohexycarbonyl-2-(p-toluenesulfonyl)propane and 2-isopropylcarbonyl-2-(p-toluenesulfonyl)propane; nitrobenzyl sulfonate dervatives such as 2,6-dinitrobenzyl p-toluenesulfonate and 2,4-dinitrobenzyl p-toluenesulfonate; sulfonic acid ester derivatives such as 1,2,3-tris(methanesulfonyloxy)benzene, 1,2,3-tris(trifluoromethanesulfonyloxy)benzene; and 1,2,3-tris(p-toluenesulfonyloxy) benzene, and sulfonic acid esters of N-hydroxyimides such as N-hydroxysuccinimide methanesulfonate, N-hydroxysuccinimide trifluoromethanesulfonate, N-hydroxysuccinimide ethanesulfonate, N-hydroxysuccinimide 1-propanesulfonate; N-hydroxysuccinimide 2-propanesulfonate; N-hydroxysuccinimide 1-pentanesulfonate; N-hydroxysuccinimide 1-octanesulfonate; N-hydroxysuccinimide p-toluenesulfonate; N-hydroxysuccinimide p-methoxybenzenesulfonate; N-hydroxysuccinimide 2-chloroethanesulfonate, N-hydroxysuccinimide benzenesulfonate, N-hydroxysuccinimide 2,4,6-trimethylbenzenesulfonate, N-hydroxysuccinimide 1-naphthalenesulfonate, N-hydroxysuccinimide 2-naphthalenesulfonate, N-hydroxy-2-phenylsuccinimide methanesulfonate, N-hydroxymaleimide methanesulfonate, N-hydroxymaleimide ethanesulfonate, N-hydroxy-2-phenylmaleimide methanesulfonate, N-hydroxyglutarimide methanesulfonate, N-hydroxyglutarimide benzenesulfonate, N-hydroxyphthalimide methanesulfonate, N-hydroxyphthalimide benzenesulfonate, N-hydroxyphthalimide trifluoromethanesulfonate, N-hydroxyphthalimide p-toluenesulfonate, N-hydroxynaphthalimide methanesulfonate, N-hydroxynaphthalimide benzenesulfonate, N-hydroxy-5-norbornene-2,3-dicarboxyimide methanesulfonate; N-hydroxy-5-norbornene-2,3-dicarboxyimide trifluoromethanesulfonate, and N-hydroxy-5-norbornene-2,3-dicarboxyimide p-toluenesulfonate.

Preferred among these acid generators are onium salts such as triphenylsulfonium trifluoromethanesulfonate, (p-tert-butoxyphenyl)diphenylsulfonium trifluoromethanesulfonate, tris(p-tert-butoxyphenyl)sulfonium trifluoromethanesulfonate, triphenyslufonium p-toluenesulfonate, (p-tert-butoxyphenyl)diphenylsulfonium p-toluenesulfonate, tris(p-tert-butoxyphenyl)sulfonium p-toluenesulfonate, trinaphthylsulfonium trifluoromethanesulfonate, cyclohexylmethyl(2-oxocyclohexyl)sulfonium trifluoromethanesulfonate, (2-norbornyl)methyl(2-oxocyclohexyl)sulfonium trifluoroethanesulfonate, and 1,2'-naphthylcarbonylmethyltetrahydrothiophenium triflate; diazomethane derivatives such as bis(benzenesulfonyl)diazomethane, bis(p-toluenesulfonyl)diazomethane, bis(cyclohexylsulfonyl)diazomethane, bis(n-butylsulfonyl)diazomethane, bis(isobutylsulfonyl)diazomethane, bis(sec-butylsulfonyl)diazomethane, bis(n-propylsulfonyl)diazomethane, bis(isopropylsulfonyl)diazomethane, and bis(tert-butylsulfonyl)diazomethane; glyoxime derivatives such as bis-O-(p-toluenesulfonyl)-α-dimethylglyoxime and bis-O-(n-butanesulfonyl)-α-dimethylglyoxime; bissulfone derivatives such as bisnaphthylsulfonylmethane; and sulfonic acid esters of N-hydroxyimide compounds such as N-hydroxysuccinimide methanesulfonate, N-hydroxysuccinimide trifluoromethanesulfonate, N-hydroxysuccinimide 1-propanesulfonate, N-hydroxysuccinimide 2-propanesulfonate, N-hydroxysuccinimide 1-pentanesulfonate, N-hydroxysuccinimide p-toluenesulfonate, N-hydroxynaphthalimide methanesulfonate, and N-hydroxynaphthalimide benzenesulfonate.

These acid generators may be used singly or in combinations of two or more thereof.

The acid generator is preferably added in an amount of 0.1 to 50 parts by weight, and especially 0.5 to 40 parts by weight, per 100 parts by weight of the base polymer. Less than 0.1 pbw of the acid generator generates an insufficient amount of acid to induce crosslinking reaction whereas more than 50 pbw of the acid generator may invite a mixing phenomenon that the acid migrates into the overlaying resist.

Basic compound

In the undercoat-forming material of the invention, a basic compound may be compounded for improving the storage stability. The basic compound plays the role of an acid quencher for preventing a small amount of acid generated from the acid generator from promoting the crosslinking reaction.

Examples of suitable basic compounds include primary, secondary, and tertiary aliphatic amines mixed amines, aromatic amines, heterocyclic amines, nitrogen-containing compounds having carboxyl group, nitrogen-containing compounds having sulfonyl group, nitrogen-containing compounds having hydroxyl group, nitrogen-containing compounds having hydroxyphenyl group, alcoholic nitrogen compounds, amide derivatives, and imide derivatives.

Examples of suitable primary aliphatic amines include ammonia, methylamine, ethylamine, n-propylamine, iso-proylamine, n-butylamine, iso-butylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine. Examples of suitable secondary aliphatic amines include dimethylamine, diethylamine, di-n-propylamine, di-iso-propylamine, di-n-butylamine, di-iso-butylamine, di-sec-butylamine, dipentylamine, dicyclopentylamine, dihexylamine, dicyclohexylamine, diheptylamine, dioctylamine, dinonylamine, didecylamine, didodecylamine, diectylamine, N,N-dimethylmethylenediamine, N,N-dimethylethylenediamine, and N,N-dimethylltetraethylenepentamine. Examples of suitable tertiary aliphatic amines include trimethylamine, triethylamine, tri-n-propylamine, tri-iso-propylamine, tri-n-butylamine, tri-iso-butylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of suitable mixed amines include dimethylethylamine, methylethylpropylamine, benzylamine, phenethylamine, and benzyldimethylamine.

Examples of suitable nitrogen-containing compounds having carboxyl group include aminobenzoic acid, indolecarboxylic acid, and amino acid derivatives (e.g., nicotinic acid, alanine, arginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine). Examples of suitable nitrogen-containing compounds having sulfonyl group include 3-pyridinesulfonic acid and pyridinium p-toluenesulfonate. Examples of suitable nitrogen-containing compounds having hydroxyl group, nitrogen-containing compounds having hydroxyphenyl group, and alcoholic nitrogen compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidine ethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotinamide. Examples of suitable amide derivatives include formamide, N-methylformamide, N,N-dimethylformamide, acetamide, N-methylacetamide, N,N-dimethylacetamide, propionamide, and benzamide. Suitable imide derivatives include phthalimide, succinimide, and maleimide.

Examples of suitable nitrogen-containing compounds having carboxyl group include aminobenzoic acid, indolecarboxylic acid, and amino acid derivatives (e.g., nicotinic acid, alanine, alginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine). Examples of suitable nitrogen-containing compounds having sulfonyl group include 3-pyridinesulfonic acid and pyridinium p-toluenesulfonate. Examples of suitable nitrogen-containing compounds having hydroxyl group, nitrogen-containing compounds having hydroxyphenyl group, and alcoholic nitrogen compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine 1-[2-(2-hydroxyethoxy)ethyl]piperazine, piperidine ethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tripanol, 1-methyl-2-pyrrolidine ethanol, 1-aziridine ethanol, N-(2-hydroxyethyl)phthalimide, and N-(2-hydroxyethyl)isonicotinamide. Examples of suitable amide derivatives include formamide, N-methylformamide, N,N-dimethylformamide, acetamide, N-methylacetamide, N,N-dimethylacetamide, propionamide, and benzamide. Suitable imide derivatives include phthalimide, succinimide, and maleimide.

The basic compound is preferably formulated in an amount of 0.001 to 2 parts by weight, and especially 0.01 to 1 part by weight, per 100 parts by weight of the entire base polymer. Less than 0.001 pbw of the basic compound may fail to provide the desired effect whereas more than 2 pbw of the basic compound may trap the entirety of thermally generated acid to inhibit crosslinking reaction.

Organic solvent

The organic solvent used in the undercoat-forming material of the invention may be any organic solvent in which the base polymer, acid generator, crosslinker and other components are soluble. Illustrative, non-limiting, examples of the organic solvent include ketones such as cyclohexanone, and methyl-2-n-amylketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; and esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl pripionate, and propylene glycol mono-tert-butyl ether acetate. These solvents may be used alone or in combinations of two or more thereof. Of the above organic solvents, preferred are diethylene glycol dimethyl ether, 1-ethoxy-2-propanol, ethyl lactate, propylene glycol monoethyl ether acetate and propylene glycol monomethyl ether, and mixtures thereof.

The organic solvent is preferably added in an amount of about 200 to 10,000 parts by weight, especially about 300 to 5,000 parts by weight per 100 parts by weight of the entire base polymer.

Like photoresists, the undercoat-forming material of the invention can be applied onto a procesable substrate by any desired technique such as spin coating, to form an undercoat layer thereon. After spin coating, the coating is desirably baked in order to evaporate off the solvent and to promote crosslinking reaction for preventing the undercoat layer from mixing with the overlaying resist. The baking is preferably effected at a temperature of 80 to 300° C. for a time of 10 to 300 seconds. The thickness of the undercoat layer may be suitably determined although it is preferably in the range of 30 to 20,000 nm, especially 50 to 15,000 nm.

Once the undercoat layer is formed, a silicon-bearing resist layer is formed thereon in the case of bilayer process, and a silicon-bearing intermediate layer is formed thereon and a silicon-free monolayer resist layer is formed on the intermediate layer in the case of tri-layer process. Any of well-known photoresist compositions may be used to form the resist layer.

As the silicon-bearing resist composition for the bilayer process, a positive photoresist composition comprising a silicon atom-bearing polymer such as a polysilsesquioxane derivative or vinylsilane derivative as a base polymer, an organic solvent, a photacid generator, and optionally, a basic compound or the like is often unsed from the standpoint of oxygen gas etching resistance. As the silicon atom-bearing polymer, any of well-known polymers which are used in resist compositions of this type may be used.

As the silicon-bearing intermediate layer for the tri-layer process, an intermediate layer based on polysilsesquioxane is preferably used. The intermediate layer having the function of an antireflective coating is effective for restraining reflection.

Especially for 193-nm exposure, while the use of a material containing more aromatic groups and having high resistance to substrate etching as the undercoat layer provides a high k value and high substrate reflection, the combined use of an intermediate layer that restrains reflection is successful in reducing the substrate reflection to 0.5% or less. As the intermediate layer having an antireflective effect, use is preferably made of anthracene for 248 and 157-nm exposure and polysilsesquioxane having phenyl groups or photo-absorbing groups having a silicon-to-silicon bond as pendants and capable ot acid- or heat-assisted crosslinking for 193-nm exposure.

Also, an intermediate layer formed by chemical vapor deposition (CVD) may be used. Know intermediate layers formed by CVD and having the increased function of an antireflective coating are SiON coatings. As compared with the CVD, formation of an intermediate layer by a spin coating technique is simple and economical. The topcoat resist in the tri-layer process may be either positive or negative and may be the same as a commonly used monolayer resist.

When the photoresist composition is applied to form a resist layer, a spin coating technique is preferably used as in the case of the undercoat layer. The resist composition is spin coated and then pre-baked, preferably at 80 to 180° C. for 10 to 300 seconds. Thereafter, the resist layer is routinely exposed to radiation through a desired pattern, post-exposure baked (PEB) and developed with a liquid developer, obtaining a resist pattern. The thickness of the resist layer is preferably in a range of 30 to 500 nm, moe preferably 50 to 400 nm, though not critical. The radiation for exposure may be selected from among high-energy radiation having a wavelength of up to 300 nm, specifically excimer laser beams of 248 nm, 193 nm and 157 nm, soft X-rays of 3 to 20 nm, electron beams, and X-rays.

Next, etching is carried out using the resist pattern as a mask. In the bilayer process, the undercoat layer is typically etched with oxygen gas. In addition to oxygen gas, an inert gas such as He or Ar or another gas such as CO, $CO_2$, $NH_3$, $SO_2$, $N_2$, $NO_2$ or $H_2$ may be added to the etching gas. The other gas is used for sidewall protection, that is, for preventing the pattern sidewalls from being undercut. Etching solely with CO, $CO_2$, $NH_3$, $SO_2$, $N_2$, $NO_2$ or $H_2$ gas without using oxygen gas is also acceptable. In the tri-layer process, the intermediate layer is etched with a fluorocarbon-base gas using the patterned resist as a mask. Then the undercoat layer is etched with oxygen gas (same as above) using the patterned intermediate layer as a mask.

Next, the processable substrate is etched by a conventional technique. For example, when the substrate is $SiO_2$ SiN, etching with a fluorocarbon-base gas is employed. When the substrate is p-Si, Al or W, etching with a chlorine or bromine-bas gas is employed. When the substrate processing is etching with a fluorocarbon-base gas, the silicon-bearing resist in the bilayer resist process and the silicon-bearing intermediate layer in the tri-layer process are stripped at the same time as the substrate processing. When the substrate is etched with a chlorine or bromine-base gas, the silicon-bearing resist or the silicon-bearing intermediate layer must be subsequently stripped by dry etching with a fluorocarbon-base gas after the substrate processing.

The undercoat layer of the invention is resistant to the etching of the substrate with any of such gases.

The processable substrate is formed on a support substrate. The support substrate includes thos of Si, α-Si, p-Si, $SiO_2$, SiN, SiON, W, TiN, Al and the like, and a suitable material different from the processable film (or processable substrate) is selected among them. The processable film is selected from low-k fimls of Si, $SiO_2$, SiON, SiN, p-Si, α-Si, W, W-Si, Al, Cu, Al-Si and the like and stop films thereof, and typically has a thickness of 50 to 10,000 nm, especially 100 to 5,000 nm.

Now referring to FIGS. 6 and 7, the bilayer resist working process and trilayer resist working process are illustrated.

Figure 6A:
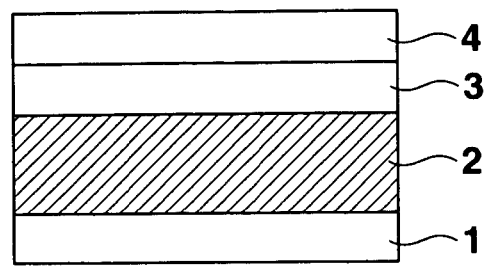
FIG. 6 illustrates steps of a bilayer resist working process.
Figure 6B:
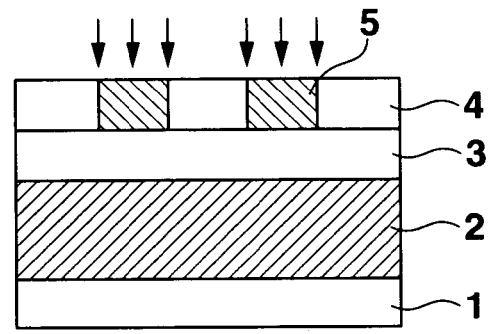
Figure 6C:
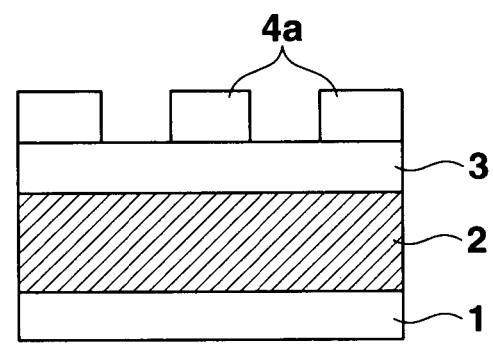
Figure 6D:
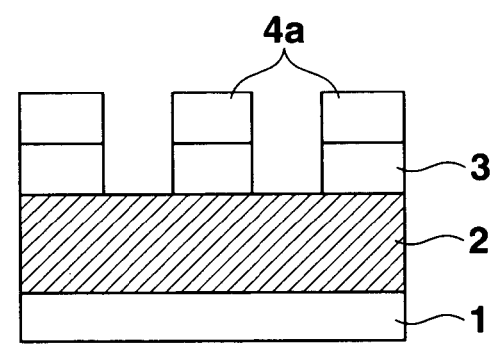
Figure 6E:
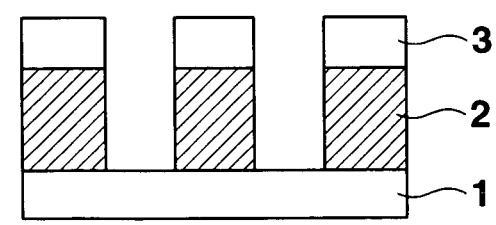

In the bilayer resist working process, as shown in FIG. 6A, an undercoat-forming material is applied onto a processable substrate (or film) 2 lying on a support substrate 1 to form an undercoaty layer 3. A photoresist composition, especially a photoresist composition comprising a silicon atom-containing polymer as a base resin is then applied onto the undercoat layer 3 to form a photoresist layer 4. Through a photomask (not shown), a predetermined region 5 of the photoresist layer 4 is exposed to light as shown in FIG. 6B. By subsequent PEB and development, a patterned photoresist layer 4a is formed as shown in FIG. 6C. Thereafter, as shown in FIG. 6D, the undercoat layer 3 is etched with an oxygen plasma using the patterned photoresist layer 4a as a mask. The patterned photoresist layer 4a is removed, after which the processable substrate 2 is processed by ethcing as shown in FIG. 6E.

Figure 7A:
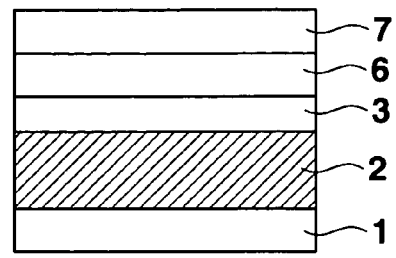
FIG. 7 illustrates steps of a trilayer resist working process.
Figure 7B:
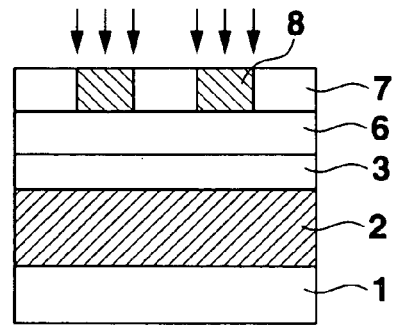
Figure 7C:
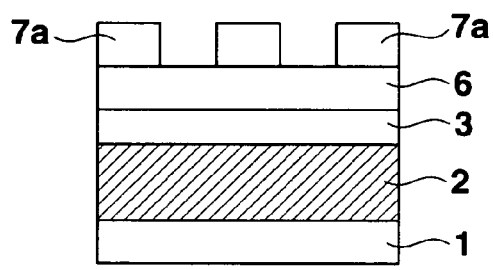
Figure 7D:
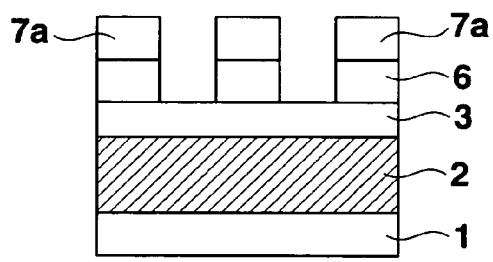
Figure 7E:
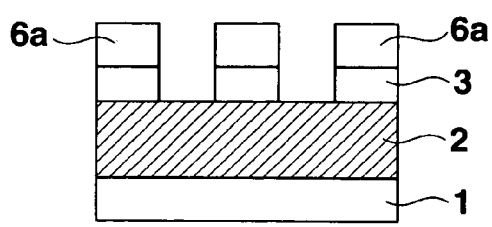
Figure 7F:
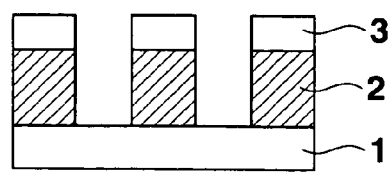

In the trilayer resist working process, as shown in FIG. 7A, an undercoat-forming material is applied onto a processable substrate (or film) 2 lying on a support substrate 1 to form an undercoat layer 3, in the same manner as in the bilayer resist process. A silicon-bearing intermediate layer 6 is then formed on the undercoat layer 3, and a monlayer photoresist layer 7 is formed on the intermediate layer 6. Next, as shown in FIG. 7B, a predetermined region 8 of the photoresist layer 7 is exposed to light. By subsequent PEB and development, a patterned photoresist layer 7a is formed as shown in FIG. 7C. Using the patterned photoresist layer 7a as a mask, the intermediate layer 6 is etched with a fluorocarbon (CF) base gas as shown in FIG. 7D. The patterned photoresist layer 7a is removed, after which the undercoat layer 3 is etched with an oxygen plasma using the patterned intermediate layer 6a as a mask as shown in FIG. 7E. Finally, the patterned intermediate layer 6a is removed, after which the processable substrate 2 is processed by etching as shown in FIG. 7F.

It is understood that a molecular weight is measured by the following procedure. A polymer is analyzed by gel permeation chromatography (GPC) using polystyrene standards, for determining a weight average molecular weight (Mw) and a number average molecular (Mn), from which a dispersity (Mw/Mn) is computed.

EXAMPLE

Synthesis Examples and Examples are given below together with Comparative Examples for further illustrating the invention although the invention is not limited thereby.

Synthesis Example 1

A 300-ml flask was charged with 120 g of m-cresol, 150 g of 4,4'-(9H-fluoren-9-ylidene)bisphenol, 75 g of 37% formalin and 5 g of oxalic acid. The contents were stirred at 100° C. for 24 hours, completing reaction. The reaction solution was poured into 500 ml of methyl isobutyl ketone, which was thoroughly washed with water to remove the catalyst and metal impurities, and the solvent stripped off in vacuum. By further heating at 150° C. in a reduced pressure of 2 mmHg, water and unreacted monomers were removed. There was obtained 255 g of Polymer 1.

The molecular weight (Mw) and dispersity (Mw/Mn) of Polymer 1 were determined by GPC. From $^1$H-NMR analysis, the ratio of monomer units in the polymer was determined.

Polymer 1:
  m-cresol/4,4'-(9H-fluoren-9-ylidene)bisphenol
  molar ration=0.67:0.33
  Mw=6,000
  Mw/Mn=3.70

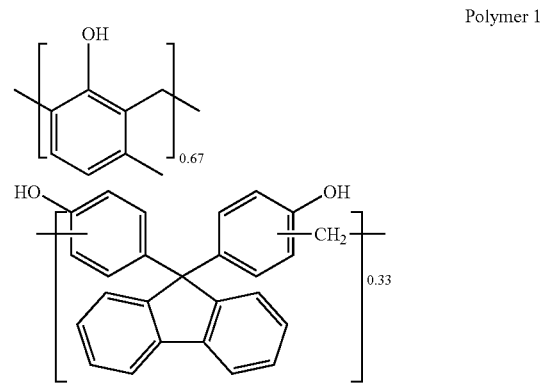

Polymer 1

Synthesis Example 2

A 300-ml flask was charged with 144 g of m-phenylpheno, 150 g of 4,4'-(9H-fluoren-9-ylidene)- bisphenol, 75 g of 37% formalin and 5 g of oxalic acid. The contents were stirred at 100° C. for 24 hours, completing reaction. The reaction solution was poured into 500 ml of methylisobutyl ketone, which was thoroughly washed with water to remove the catalyst and metal impurities, and the solvent stripped off in vacuum. By further heating at 150° C. in a reduced pressure of 2 mmHg, water and unreacted monomers were removed. There was obtained 277 g of Polymer 2.

The molecular weight (Mw) and dispersity (Mw/Mn) of Polymer 2 were determined by GPC. From $^1$H-NMR analysis, the ratio of monomer units in the polymer was determined.

Polymer 2:
  m-phenylphenol/4,4'-(9H-fluoren-9-ylidene)bisphenol
  molar ratio=0.63:0.37
  Mw=4,800
  Mw/Mn=3.20

Polymer 2

Synthesis Example 3

A 300-ml flask was charged with 120 g of m-cresol, 144 g of 2,2'-dimethyl-4,4'-(9H-fluoren-9-ylidene)bisphenol, 75 g of 37% formalin and 5 g o of oxalic acid. The contents were stirred at 120° C. for 24 hours, completing reaction. The reaction solution was poured into 500 ml of methyl isobutyl ketone, which was thoroughly washed with water to remove the catalyst and metal impurities, and the solvent stripped off in vacuum. By further heating at 150° C. in a reduced pressure of 2 mmHg, water and unreacted monomers were removed. There was obtained 248 g of Polymer 3.

The molecular weight (Mw) and dispersity (Mw/Mn) of Polymer 3 were determined by GPC. From $^1$H-NMR analysis, the ratio of monomer units in the polymer was determined.

Polymer 3:
m-cresol/2,2'-dimethyl-4,4'-(9H-fluoren-9-ylidene)bisphenol
molar ratio=0.74:0.26
Mw=4,000
Mw/Mn=3.80

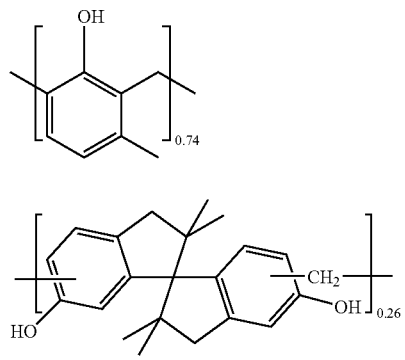

Polymer 3

Synthesis Example 4

A 300-ml flask was charged with 120 g of Polymer 1 and 41 g of 9-anthracenemethanol which were dissolved in THF solvent and combined with 0.5 g of tosylic acid. The contents were stirred at 80° C. for 24 hours, completing reaction. The reaction solution was thoroughly washed with water to remove the catalyst and metal impurities, and the THF stripped off in vacuum. There was obtained 155 g of Polymer 4.

The molecular weight (Mw) and dispersity (Mw/Mn) of Polymer 4 were determined by GPC. From $^1$H-NMR analysis, the ratio of anthracenemethyl groups in the polymer was determined.

Polymer 4.
m-cresol/p-anthracenemethyl-m-cresol/ 4,4'-(9H-fluoren-9-ylidene)bisphenol
molar ratio=0.44:0.23:0.33
Mw=6,700
Mw/Mn=3.70

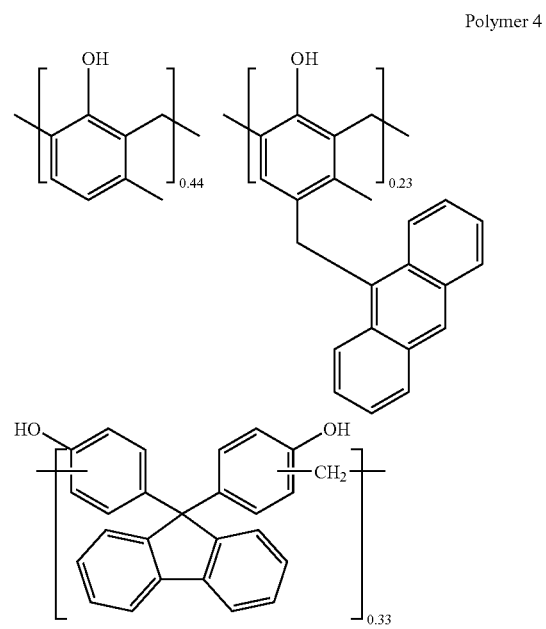

Polymer 4

Synthesis Example 5

A 300-ml flask was charged with 180 g of 4,4'-(9H-fluoren-9-ylidene)bisphenol, 75 g of 37% formalin and 5 g of oxalic acid. The contents were stirred at 100° C. for 24 hours, completing reaction. The reaction solution was poured into 500 ml of methyl isobutyl ketone, which was thoroughly washed with water to remove the catalyst and metal impurities, and the solvent stripped off in vacuum. By further heating at 150° C. in a reduced pressure of 2 mmHg, water and unreacted monomers were removed. There was obtained 163 g of Polymer 5.

The molecular weight (Mw) and dispersity (Mw/Mn) of Polymer 5 were determined by GPC. From $^1$H-NMR analysis, the ratio of monomer units in the polymer was determined.

Polymer 5:
4,4'-(9H-fluoren-9-ylidene)bisphenol
molar ratio=1.0
Mw=11,000
Mw/Mn=4.40

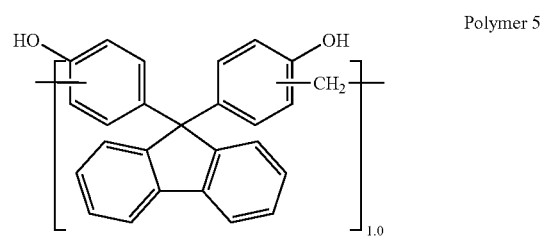

Polymer 5

Synthesis Example 6

A 300-ml flask was charged with 40 g of indene, 180 g of 4,4'-(9H-fluoren-9-ylidene)bisphenol, 75 g of 37% formalin and 5 g of oxalic acid. The contents were stirred at 100° C. for 24 hours, completing reaction. The reaction solution was poured into 500 ml of methyl isobutyl ketone, which was thoroughly washed with water to remove the catalyst and metal impurities, and the solvent stripped off in vacuum. By further heating at 150° C. in a reduced pressure of 2 mmHg, water and unreacted monomers were removed. There was obtained 195 g of Polymer 6.

The molecular weight (Mw) and dispersity (Mw/Mn) of Polymer 6 were determined by GPC. From $^1$H-NMR analysis, the ratio of monomer units in the polymer was determined.

Polymer 6:
indene/4,4'-(9H-fluoren-9-ylidene)bisphenol
molar ratio=0.3:0.7
Mw=8,800
Mw/Mn=3.40

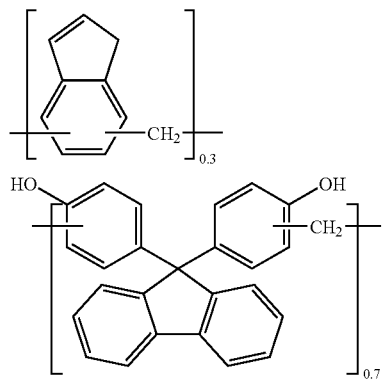

Polymer 6

Synthesis Example 7

A 300-ml flask was charged with 58 g of acenaphthylene, 180 g of 4,4'-(9H-fluoren-9-ylidene)- bisphenol, 75 g of 37% formalin and 5 g of oxalic acid. The contents were stirred at 100° C. for 24 hours, completing reaction. The reaction solution was poured into 500 ml of methyl isobutyl ketone, which was thoroughly washed with water to remove the catalyst and metal impurities, and the solvent stripped off in vacuum. By further heating at 150° C. in a reduced pressure of 2 mmHg, water and unreacted monomers were removed. There was obtained 195 g of Polymer 7.

The molecular weight (Mw) and dispersity (Mw/Mn) of Polymer 7 were determined by GPC. From $^1$H-NMR analysis, the ratio of monomer units in the polymer was determined.

Polymer 7:
acenaphthylene/4,4'-(9H-fluoren-9-ylidene)bisphenol
molar ratio=0.34:0.66
Mw=9,300
Mw/Mn=3.80

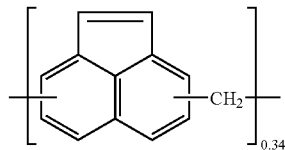

Polymer 7

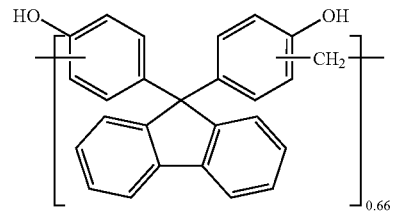

Comparative Synthesis Example 1

A 500-ml flask was charged with 82 g of 4-hydroxystyrene, 85 g of 2-methacrylic acid-1-anthracene-methyl, and 40 g of toluene as a solvent. The flask was cooled at −70° C. in a nitrogen atmosphere, after which vacuum evacuation and nitrogen flow were repeated three times. Room temperature was resumed, and 4.1 g of AIBN was added as a polymerization initiator. The temperature was increased to 80° C., at which reaction was effected for 24 hours. The reaction solution was concentrated to ½ volume, and poured into a mixture of 300 ml of methanol and 50 ml of water for precipitation. The resulting white solid was filtered and dried in vacuum at 60° C., obtaining 133 g of a white polymer. The polymer was analyzed by $^1$H-NMR and GPC, with the results shown below.

Copolymer compositional ratio:
4-hydroxystyrene/2-methacrylic acid-1-anthracenemethyl=56:44
Mw=14,400
Mw/Mn=1.77

Examples and Comparative Examples

An undercoat layer-coating solution and an intermediate layer-coating solution were prepared by dissolving a polymer (Polymers 1 to 7 or polymer of Comparative Synthesis Example 1) or a silicon-bearing polymer for intermediate layer, an acid generator (AG1, AG2), and a crosslinker (CR1, CR2) in a solvent containing 0.1 wt % of Fluorad FC-430 (3M-Sumitomo Co., Ltd.) according to the formulation shown in Table 1, and passing through a fluoroplastic filter having a pore size of 0.1 µm.

Additional comparative polymers included a m-cresol novolak resing having a Mw of 8,800 and a Mw/Mn of 4.5, and a polyhydroxystyrene having a Mw of 9,200 and a Mw/Mn of 1.05.

The topcoat resist solution was prepared by dissolving a resin, an acid generator, and a basic compound in a solvent containing 0.1 wt % of FC-430 (3M-Sumitomo Co., Ltd.)

according to the formulation shown in Table 2, and passing through a fluoroplastic filter having a pore size of 0.1 μm.

The undercoat-forming material solution and the intermediate layer-coating solution were separately applied onto a silicon substrate and baked at 200° C. for 60 seconds to form a polymer layer of 300 nm thick, designated UDL1 to UDL8, as the undercoat layer and a silicon-bearing layer of 100 nm thick as the intermediate layer, designated SOG1 and SOG2. Using a variable angle spectroscopic ellipsometer (VASE®) of J. A. Wollam Co., the refractive index (n, k) at wavelength 248 nm, 193 nm and 157 nm of UDL1 to UDL8 and SOG1 and SOG2 was determined. The results are also shown in Table 1.

TABLE 1

| No. | Polymer (pbw) | Crosslinker (pbw) | Acid generator (pbw) | Solvent (pbw) | Refractive index (248 nm) n | k | Refractive index (193 nm) n | k | Refractive index (157 nm) n | k |
|---|---|---|---|---|---|---|---|---|---|---|
| UDL1 | Polymer 1 (28.0) | CR1 (10) | AG1 (1) | PGMEA (100) | 1.92 | 0.10 | 1.47 | 0.50 | 1.42 | 0.15 |
| UDL2 | Polymer 2 (28.0) | CR1 (10) | AG1 (1) | PGMEA (100) | 2.01 | 0.11 | 1.45 | 0.55 | 1.41 | 0.16 |
| UDL3 | Polymer 3 (28.0) | CR1 (10) | AG1 (1) | PGMEA (100) | 1.94 | 0.09 | 1.40 | 0.61 | 1.38 | 0.12 |
| UDL4 | Polymer 4 (28.0) | CR1 (10) | AG1 (1) | PGMEA (100) | 1.97 | 0.27 | 1.48 | 0.45 | 1.42 | 0.24 |
| UDL5 | Polymer 1 (28.0) | CR1 (10) | AG2 (1) | PGMEA (100) | 1.97 | 0.11 | 1.46 | 0.53 | 1.42 | 0.16 |
| UDL6 | Polymer 5 (28.0) | CR1 (10) | AG1 (1) | PGMEA (100) | 2.10 | 0.25 | 1.35 | 0.64 | 1.38 | 0.22 |
| UDL7 | Polymer 6 (28.0) | CR1 (10) | AG1 (1) | PGMEA (100) | 1.93 | 0.27 | 1.38 | 0.43 | 1.36 | 0.23 |
| UDL8 | Polymer 7 (28.0) | CR1 (10) | AG1 (1) | PGMEA (100) | 2.15 | 0.28 | 1.32 | 0.39 | 1.32 | 0.25 |
| SOG1 | KrF Si-bearing intermediate layer polymer 1 (20) | CR1 (5) | AG2 (1) | PGMEA (1000) | 1.78 | 0.15 | 1.53 | 0.28 | 1.50 | 0.22 |
| SOG2 | ArF Si-bearing intermediate layer polymer 1 (20) | — | AG2 (1) | PGMEA (1000) | 1.60 | 0.01 | 1.53 | 0.15 | 1.56 | 0.07 |
| Comparative UDL-1 | Comparative Polymer 1 (28.0) | — | AG1 (1) | PGMEA (100) | 1.75 | 0.42 | 1.38 | 0.57 | 1.44 | 0.22 |
| Comparative UDL-2 | m-cresol novolak (28.0) | CR1 (10) | AG1 (1) | PGMEA (100) | 1.96 | 0.03 | 1.28 | 0.62 | 1.36 | 0.13 |
| Comparative UDL-3 | poly-p-hydroxystyrene | CR1 (10) | AG1 (1) | PGMEA (100) | 1.80 | 0.01 | 1.62 | 0.58 | 1.45 | 0.08 |

PGMEA: propylene glycol monomethyl ether acetate

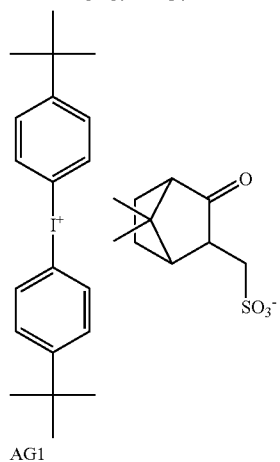

AG1

TABLE 1-continued

| No. | Polymer (pbw) | Crosslinker (pbw) | Acid generator (pbw) | Solvent (pbw) | Refractive index (248 nm) | | Refractive index (193 nm) | | Refractive index (157 nm) | |
|---|---|---|---|---|---|---|---|---|---|---|
| | | | | | n | k | n | k | n | k |

AG2

CR1

TABLE 2

| No. | Polymer (pbw) | Acid generator (pbw) | Base (pbw) | Solvent (pbw) |
|---|---|---|---|---|
| SL resist for KrF | KrF monolayer resist polymer 1 (100) | PAG1 (4.0) | TMMEA (0.3) | PGMEA (1200) |
| SL resist for ArF | ArF monolayer resist polymer 1 (100) | PAG1 (2.2) | TMMEA (0.3) | PGMEA (1200) |

(KrF monolayer resist polymer 1)
(r = 0.70, s = 0.10, t = 0.20
Mw = 9,300)

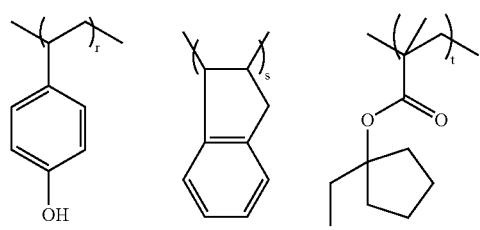

(ArF monolayer resist polymer 1)
(u = 0.40, v = 0.30, w = 0.30
Mw = 7,800)

TMMEA

TABLE 2-continued

| No. | Polymer (pbw) | Acid generator (pbw) | Base (pbw) | Solvent (pbw) |
|-----|---------------|----------------------|------------|---------------|

PAG1: triphenylsulfonium perfluorobutanesulfonate ($S^+CF_3CF_2CF_2CF_2SO_3^-$ with three phenyl groups)

PAG1
(KrF Si-bearing intermediate layer polymer 1)
(m = 0.30, n = 0.70
Mw = 2,500)

(ArF Si-bearing intermediate layer polymer 1)
(o = 0.20, p = 0.50, q = 0.3
Mw = 3,400)

An undercoat-forming material solution (UDL4, Comparative UDL1-3) was applied onto a $SiO_2$ substrate of 300 nm thick and baked at 200° C. for 90 seconds to form an undercoat layer of 300 nm thick. A silicon-bearing intermediate layer-forming material solution SOG1 was applied thereon and baked at 200° C. for 60 seconds to form an intermediate layer of 130 nm thick. Then a KrF exposure resist polymer 1 solution was applied and baked at 120° C. for 60 seconds to form a photoresist layer of 200 nm thick.

Thereafter, the resist layer was exposed using a KrF laser stepper S203B (Nikon Corporation, NA 0.68, σ0.75, ⅔ annular illumination, Cr mask), then baked (PEB) at 120° C. for 60 seconds, and developed for 60 seconds with a 2.38 wt % aqueous solution of tetramethylammonium hydroxide (TMAH), thereby giving a positive pattern. The shape of the 0.15 μm line-and-space pattern was observed. The results are shown in Table 5.

Separately, an undercoat-forming material solution (UDL-8, Comparative UDL1-3) was applied onto a $SiO_2$ substrate of 300 nm thick and baked at 200° C. for 60 seconds to form an undercoat layer of 300 nm thick. A silicon-bearing intermediate layer-forming material solution SOG2 was applied thereon and baked at 200° C. for 60 seconds to form an intermediate layer of 100 nm thick. Then an ArF exposure resist polymer 1 solution was applied and baked at 130° C. for 60 seconds to form a photoresist layer of 200 nm thick.

Thereafter, the resist layer was exposed using an ArF laser stepper S305B (Nikon Corporation, NA 0.68, σ0.85, ⅔ annular illumination, Cr mask), then baked (PEB) at 110° C. for 60 seconds, and developed for 60 seconds with a 2.38 wt % aqueous solution of TMAH, thereby giving a positive pattern. The shape of the 0.12 μm line-and-space pattern was observed. The results are shown in Table 6.

Next, dry etching tests were conducted. There were prepared undercoat layers (UDL1-8, Comparative UDL1-3) as used for the measurement of refractive index. These undercoat layers were examined by a test (1) of etching with $CF_4/CHF_3$ gas using a dry etching instrument TE-8500P by Tokyo Electron K. K. A difference in thickness of the undercoat layer or resist before and after the etching test was determined. The results are shown in Table 3.

| (1) $CF_4/CHF_3$ gas etching test | |
|---|---|
| Chamber pressure | 40.0 Pa |
| RF power | 1300 W |
| Gap | 9 mm |
| $CHF_3$ gas flow rate | 30 ml/min |
| $CF_4$ gas flow rate | 30 ml/min |
| Ar gas flow rate | 100 ml/min |
| Time | 60 sec |

The undercoat layers (UDL1-8, Comparative UDL1-3) were further examined by a test (2) of etching with $Cl_2/BCl_3$ gas using a dry etching instrument L-507D-L by Nichiden Anerba K. K. A difference in thickness of the polymer layer before and after the etching test was determined. The results are shown in Table 4.

| (2) $Cl_2/BCl_3$ gas etching test | |
|---|---|
| Chamber pressure | 40.0 Pa |
| RF power | 300 W |
| Gap | 9 mm |
| $Cl_2$ gas flow rate | 30 ml/min |
| $BCl_3$ gas flow rate | 30 ml/min |
| $CHF_3$ gas flow rate | 100 ml/min |
| $O_2$ gas flow rate | 2 ml/min |
| Time | 60 sec |

Additionally, the resist pattern resulting from the KrF or ArF exposure and development was transferred to the SOG film by etching. The etching conditions (3) are given below.

| (3) Transfer to SOG by etching | |
|---|---|
| Chamber pressure | 40.0 Pa |
| RF power | 1000 W |
| Gap | 9 mm |
| $CHF_3$ gas flow rate | 20 ml/min |
| $CF_4$ gas flow rate | 60 ml/min |
| Ar gas flow rate | 200 ml/min |
| Time | 30 sec |

Next, the pattern transferred to the SOG film was further transferred to the undercoat layer by etching with oxygen-base gas. The etching conditions (4) are given below.

| (4) Transfer to undercoat by etching | |
| --- | --- |
| Chamber pressure | 450 mTorr |
| RF power | 600 W |
| Gap | 9 mm |
| Ar gas flow rate | 40 sccm |
| $O_2$ gas flow rate | 60 sccm |
| Time | 20 sec |

Finally, using the patterned undercoat layer as a mask, the $SiO_2$ substrate was processed under the etching condtions (1).

TABLE 3

| | $CF_4/CHF_3$ gas etching rate (nm/min) |
| --- | --- |
| UDL1 | 85 |
| UDL2 | 72 |
| UDL3 | 76 |
| UDL4 | 80 |
| UDL5 | 86 |
| UDL6 | 70 |
| UDL7 | 65 |
| UDL8 | 66 |
| Comparative UDL1 | 144 |
| Comparative UDL2 | 120 |
| Comparative UDL3 | 129 |

TABLE 4

| | $Cl_2/BCl_3$ gas etching rate (nm/min) |
| --- | --- |
| UDL1 | 92 |
| UDL2 | 85 |
| UDL3 | 88 |
| UDL4 | 83 |
| UDL5 | 91 |
| UDL6 | 80 |
| UDL7 | 76 |
| UDL8 | 72 |
| Comparative UDL1 | 166 |
| Comparative UDL2 | 132 |
| Comparative UDL3 | 140 |

A cross-sectional shape of the pattern was observed under an electron microscope S-4700 (Hitachi, Ltd.). The pattern shape was compared in this way, with the results shown in Tables 5 and 6.

TABLE 5

| No. | Topcoat resist | Pattern shape after development | SOG shape after transfer etching | Undercoat layer shape after transfer etching | Substrate shape after transfer etching |
| --- | --- | --- | --- | --- | --- |
| UDL4 | SL resist for KrF | perpendicular | perpendicular | perpendicular | perpendicular |
| Comparative UDL1 | SL resist for KrF | perpendicular | perpendicular | perpendicular | tapered and slimmed |
| Comparative UDL2 | SL resist for KrF | pattern collapsed by standing wave generation | — | — | — |
| Comparative UDL3 | SL resist for KrF | pattern collapsed by standing wave generation | — | — | — |

TABLE 6

| No. | Topcoat resist | Pattern shape after development | SOG shape after transfer etching | Undercoat layer shape after transfer etching | Substrate shape after transfer etching |
| --- | --- | --- | --- | --- | --- |
| UDL1 | SL resist for ArF | perpendicular | perpendicular | perpendicular | perpendicular |
| UDL2 | SL resist for ArF | perpendicular | perpendicular | perpendicular | perpendicular |
| UDL3 | SL resist for ArF | perpendicular | perpendicular | perpendicular | perpendicular |
| UDL4 | SL resist for ArF | perpendicular | perpendicular | perpendicular | perpendicular |
| UDL5 | SL resist for ArF | perpendicular | perpendicular | perpendicular | perpendicular |
| UDL6 | SL resist for ArF | perpendicular | perpendicular | perpendicular | perpendicular |
| UDL7 | SL resist for ArF | perpendicular | perpendicular | perpendicular | perpendicular |
| UDL8 | SL resist for ArF | perpendicular | perpendicular | perpendicular | perpendicular |
| Comparative UDL1 | SL resist for ArF | perpendicular | perpendicular | perpendicular | tapered and slimmed |

TABLE 6-continued

| No. | Topcoat resist | Pattern shape after development | SOG shape after transfer etching | Undercoat layer shape after transfer etching | Substrate shape after transfer etching |
|---|---|---|---|---|---|
| Comparative UDL2 | SL resist for ArF | perpendicular | perpendicular | perpendicular | tapered |
| Comparative UDL3 | SL resist for ArF | perpendicular | perpendicular | perpendicular | tapered |

It is seen from Tables 3 and 4 that when etched with $CF_4/CHF_3$ gas and $Cl_2/BCl_3$ gas, the undercoat layers witin the scope of the invention exhibit significantly slower etching rates than the ordinary novolak resin and polyhydroxystyrene. As seen from Tables 5 and 6, the shape of resist after development, and the shape of undercoat layer after oxygen etching and after substrate processing by etching are satisfactory.

Japanese Patent Application No. 2003-345128 is incorporated herein by reference.

Although some preferred embodiments have been described, many modifications and variations may be made thereto in light of the above teachings. It is therefore to be understood that the invention may be practice otherwise than as specifically described without departing from the scope of the appended claims.

The invention claimed is:

1. An undercoat-forming material comprising:
   (a) a novolak resin having a fluorene structure consisting essentialy of recurring units of the general formula (1a):

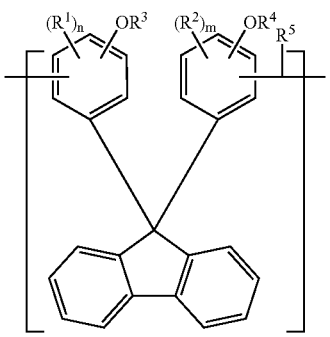

(1a)

wherein $R^1$ and $R^2$ are each independently hydrogen, a straight, branched or cyclic $C_1$-$C_{10}$ alkyl group, a $C_6$-$C_{10}$ aryl group, allyl or halogen atom; $R^3$ and $R^4$ are each independently hydrogen, a straight, branched or cyclic $C_1$-$C_6$ alkyl group, a straight, branched or cyclic $C_2$-$C_6$ alkenyl group, a $C_6$-$C_{10}$ aryl group or a glycidyl group; $R^5$ is hydrogen, a straight, branched or cyclic $C_1$-$C_{10}$ alkyl group or a $C_6$-$C_{10}$ aryl group; and n and m are each an integer of 1 to 3; and an acid generator selected from the group consisting of:
   (i) onium salts of the formula (Pla-1), (Pla-2), (Pla-3) or (Plb),
   (ii) diazomethane derivatives of the formula (P2),
   (iii) glyoxime derivatives of the formula (P3),
   (iv) bissulfone derivatives of the formula (P4),
   (v) sulfonic acid esters of N-hydroxyimide compounds of the formula (P5),
   (vi) β-ketosulfonic acid derivatives,
   (vii) disulfone derivatives,
   (viii) nitrobenzylsulfonate derivatives, and
   (ix) sulfonate derivatives:

(Pla-1)

(Pla-2)

(Pla-3)

wherein $R^{101a}$, $R^{101b}$, and $R^{101c}$ independently represent straight, branched or cyclic alkyl, alkenyl, oxoalkyl or oxoalkenyl groups of 1 to 12 carbon atoms, aryl groups of 6 to 20 carbon atoms, or aralkyl or aryloxoalkyl groups of 7 to 12 carbon atoms, wherein some of all of the hydrogen atoms may be replaced by alkoxy or other groups; $R^{101b}$ and $R^{101c}$, taken together, may form a ring; $R^{101b}$ and $R^{101c}$ each are alkylene groups of 1 to 6 carbon atoms when they form a ring; K is a non-nucleophilic counter ion; $R^{101d}$, $R^{101e}$, $R^{101f}$, and $R^{101g}$ stand for the same as $R^{101a}$, $R^{101b}$, and $R^{101c}$ as well as hydrogen atoms; a pair of $R^{101d}$ and $R^{101e}$ or a combination of $R^{101d}$, $R^{101e}$ and $R^{101f}$ may form a ring, and each of $R^{101d}$ and $R^{101e}$ or each of $R^{101d}$, $R^{101e}$ and $R^{101f}$ is an alkylene group of 3 to 10 carbon atoms when they form a ring; $R^{101d}$, $R^{101e}$, $R^{101f}$, and $R^{101g}$, taken together, represent a heterocyclic aromatic ring having the nitrogen atom in the formula incorporated therein;

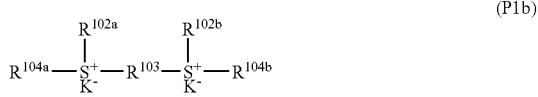

(Plb)

wherein $R^{102a}$ and $R^{102b}$ independently represent straight, branched or cyclic alkyl groups of 1 to 8 carbon atoms, $R^{103}$ represents a straight, branched or cyclic alkylene group of 1 to 10 carbon atoms, $R^{104a}$ and $R^{104b}$ independently represent 2-oxoalkyl groups of 3 to 7 carbon atoms, and K is a non-nucleophilic counter ion;

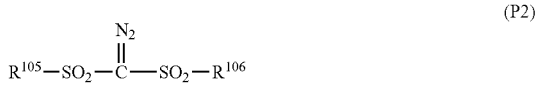

(P2)

wherein $R^{105}$ and $R^{106}$ independently represent straight, branched or cyclic alkyl or halogenated alkyl groups of 1 to 12 carbon atoms, aryl or halogenated aryl groups of 6 to 20 carbon atoms, or aralkyl groups of 7 to 12 carbon atoms;

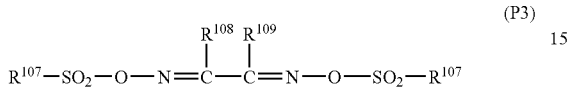

(P3)

wherein $R^{107}$, $R^{108}$, and $R^{109}$ independently represent straight, branched or cyclic alkyl or halogenated alkyl groups of 1 to 12 carbon atoms, aryl or halogenated aryl groups of 6 to 20 carbon atoms, or aralkyl groups of 7 to 12 carbon atoms, $R^{108}$ and $R^{109}$, taken together, may form a ring, and $R^{108}$ and $R^{109}$ each are straight or branched alkylene groups of 1 to 6 carbon atoms when they form a ring;

(P4)

wherein $R^{101a}$ and $R^{101b}$ are as defined above; and

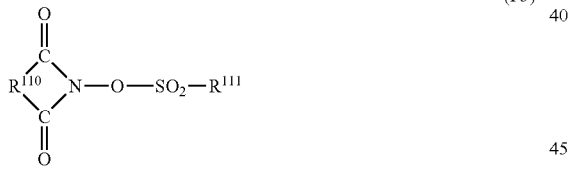

(P5)

wherein $R^{110}$ is an arylene group of 6 to 10 carbon atoms, an alkylene group of 1 to 6 carbon atoms, or an alkeylene group of 2 to 6 carbon atoms wherein some or all of the hydrogen atoms may be replaced by straight or branched alkyl or alkoxy groups of 1 to 4 carbon atoms, nitro, acetyl, or phenyl groups, $R^{111}$ is a straight, branched or cyclic allkyl group of 1 to 8 carbon atoms, alkenyl, alkoxyalkyl, phenyl or naphthyl group wherein some or all of the hydrogen atoms may be replaced by alkyl or alkoxy groups of 1 to 4 carbon atoms, phenyl groups which may have substituted thereon an alkyl or alkoxy of 1 to 4 carbon atoms, nitro, or acetyl group, hetero-aromatic groups of 3 to 5 carbon atoms, or chlorine or fluorine atoms.

2. The undercoat-forming material of claim 1, further comprising an organic solvent.

3. The undercoat-forming material of claim 1, further comprising a crosslinker.

4. A patterning process comprising the steps of:
applying an undercoat-forming material comprising a novolak resin having a fluorene or tetrahydrospirobiindene structure comprising recurring units of the general formula (1a) or (1b):

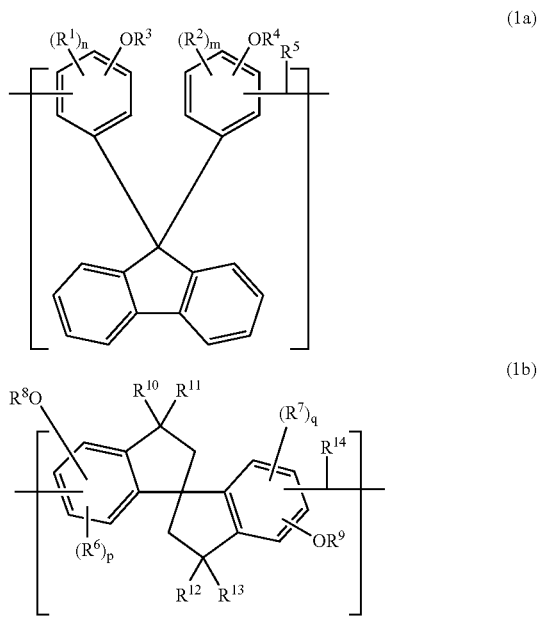

wherein $R^1, R^2, R^6$ and $R^7$ are each independently hydrogen, a straight, branched or cyclic $C_1$-$C_{10}$ alkyl group, a $C_6$-$C_{10}$ aryl group, allyl or halogen atom; $R^3, R^4, R^8$ and $R^9$ are each independently hydrogen, a straight, branched or cyclic $C_1$-$C_6$ alkyl group, a straight, branched or cyclic $C_2$-$C_6$ alkenyl group, a $C_6$-$C_{10}$ aryl group or a glycidyl group; $R^5$ and $R^{14}$ are each independently hydrogen, a straight, branched or cyclic $C_1$-$C_{10}$ alkyl group or a $C_6$-$C_{10}$ aryl group; n, m, p and q are each an integer of 1 to 3; $R^{10}$ to $R^{13}$ are each independently hydrogen, halogen, hydroxyl, a straight, branched or cyclic $C_1$-$C_6$ alkyl group or a straight, branched or cyclic $C_1$-$C_6$ alkoxy group, onto a processable substrate to form an undercoat layer, applying a photoresist composition onto the undercoat layer to form a photoresist layer, exposing the photoresist layer in a predetermined region to radiation, developing the photoresist layer with a developer to form a photoresist pattern, and processing the undercoat layer and the substrate through the patterned photoresist layer as a mask, by means of a dry etching apparatus.

5. The patterning process of claim 4, wherein said photoresist composition comprises a silicon atom-bearing polymer, and the processing step includes dry etching and undercoat layer through the photoresist layer as a mask with an oxygen-based etching gas.

6. A patterning process comprising the steps of:
applying an undercoat-forming material comprising a novolak resin having a fluorene or tetrahydrospirobiindene structure comprising recurring units of the general formula (1a) or (1b):

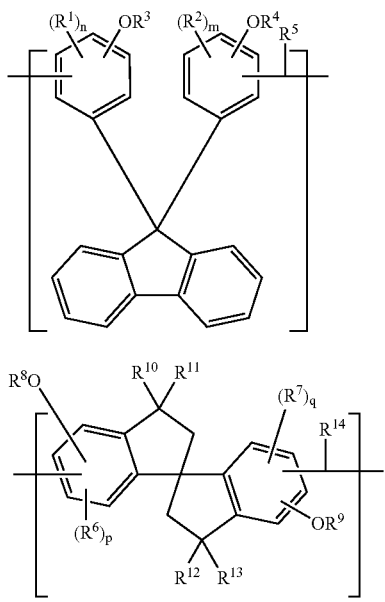

$$(1a)$$

$$(1b)$$

wherein $R^1$, $R^2$, $R^6$ and $R^7$ are each independently hydrogen, a straight, branched or cyclic $C_1$-$C_{10}$ alkyl group, a $C_6$-$C_{10}$ aryl group, allyl or halogen atom; $R^3$, $R^4$, $R^8$ and $R^9$ are each independently hydrogen, a straight, branched or cyclic $C_1$-$C_6$ alkyl group, a straight, branched or cyclic $C_2$-$C_6$ alkenyl group, a $C_6$-$C_{10}$ aryl group or a glycidyl group; $R^5$ and $R^{14}$ are each independently hydrogen, a straight, branched or cyclic $C_1$-$C_{10}$ alkyl group or a $C_6$-$C_{10}$ aryl group; n, m, p and q are each an integer of 1 to 3; $R^{10}$ to $R^{13}$ are each independently hydrogen, halogen, hydroxyl, a straight, branched or cyclic $C_1$-$C_6$ alkyl group or a straight, branched or cyclic $C_1$-$C_6$ alkoxy group,
  onto a processable substrate to form an undercoat layer,
  applying a silicon atom-containing intermediate layer over the undercoat layer,
  applying a photoresist composition onto the intermediate layer to form a photoresist layer,
  exposing the photoresist layer in a predetermined region to radiation,
  developing the photoresist layer with a developer to form a photoresist pattern,
  processing the intermediate layer through the patterned photoresist layer as a mask,
  removing the patterned photoresist layer, and,
  processing the undercoat layer and then the substrate through the processed intermediate layer as a mask,
  the processing steps using a dry etching apparatus.

7. The patterning process of claim 6, wherein said photoresist composition comprises a silicon atom-free polymer, and the step of processing the undercoat layer includes dry etching with an oxygen-based etching gas.

8. An undercoat-forming material comprising:
  (a) a novolak resin consisting essentially of recurring units obtained by condensation reacting with an aldehyde (A) a phenol having a fluorene structure selected from the group consisting of
4,4'-(9H-fluoren-9-ylidene)bisphenol,
2,2'-dimethyl-4,4'-(9H-fluoren-9-ylidene)bisphenol,
2,2'-diallyl-4,4'-(9H-fluoren-9-ylidene)bisphenol,
2,2'-difluoro-4,4-(9H-fluoren-9-ylidene)bisphenol,
2,2'-diphenyl-4,4'-(9H-fluoren-9-ylidene)bisphenol, and
2,2'-dimethoxy-4,4'-(9H-fluoren-9-ylidene)bisphenol, and with (C) a copolymerizable phenol selected from the group consisting of phenol, o-cresol, m-cresol, p-cresol, 2,3-dimethylphenol,
2,5-dimethylphenol, 3,4-dimethylphenol, 3,5-dimethylphenol, 2,4-dimethylphenol,
2,6-dimethylphenol, 2,3,5-trimethylphenol, 3,4,5-trimethylphenol, 2-t-butylphenol, 3-t-butylphenol,
4-t-butylphenol, 2-phenylphenol, 3-phenylphenol, 4-phenylphenol, 3,5-diphenylphenol,
2-naphthylphenol, 3-naphthylphenol, 4-naphthylphenol, 4-tritylphenol, resorcinol, 2-methylresorcinol,
4-methylresorcinol, 5-methylresorcinol, catechol, 4-t-butylcatechol, 2-methoxyphenol,
3-methoxyphenol, 2-propylphenol, 3-propylphenol, 4-propylphenol, 2-isopropylphenol,
3-isopropylphenol, 4-isopropylphenol, 2-methoxy-5-methylphenol, 2-t-butyl-5-methylphenol, pyrogallol, thrmol, and isothymol, and/or (D) a copolymerizable monomer selected from the group consisting of 1-naphthol, 2-naphthol, 2-methyl-1-naphthol, 4-methoxy-1-naphthol, 7-methoxy-2-napthol; dihydroxynaphthalenes, methyl 3-hydroxy-naphthalene-2-carboxylate, indene, hydroxyindene, benzofuran, hydroxyanthracene, acenaphthylene, biphenyl, bisphenol, trisphenol, dicyclopentadiene, tetrahydroindene, 4-vinylcyclohexene, norbornadiene, 5-vinylnorborn-2-ene,
α-pinene, β-pinene, and limonene, so that the phenol (A), phenol (C), and copolymerizable monomer (D) are combined in such proportion as to meet a molar ratio: [A]/[A+c+D]+0.1 to 1.0; and
  (b) an acid generator selected from the group consisting of:
  (i) onium salts of the formula (Pla-1), (Pla-2), (Pla-3) or (P1b),
  (ii) diazomethane derivatives of the formula (P2),
  (iii) glyoxime derivatives of the formula (P3),
  (iv) bissulfone derivatives of the formula (P4),
  (v) sulfonic acid esters of N-hydroxyimide compounds of the formula (P5),
  (vi) β-ketosulfonic acid derivatives,
  (vii) dislufone derivatives,
  (viii) nitrobenzylsulfonate derivatives, and
  (ix) sulfonate derivatives:

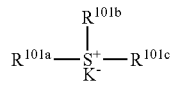

$$(Pla-1)$$

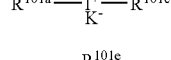

$$(Pla-2)$$

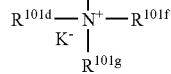

$$(Pla-3)$$

wherein $R^{101a}$, $R^{101b}$, and $R^{101c}$ independently straight, branched or cyclic alkyl, alkenyl, oxoalkyl or oxoalkenyl groups of 1 to 12 carbon atoms, aryl groups of 6 to 20 carbon atoms, or aralkyl or aryloxoalkyl groups of 7 to 12 carbon atoms, wherein some or all of the hydrogen atoms may be replaced by alkoxy or other groups, $R^{101b}$ and $R^{101c}$, taken together, may form a ring, $R^{101b}$ and $R^{101c}$ each are alkylene groups of 1 to 6 carbon atoms when they form a ring, K is a non-nucleophilic counter ion, $R^{101d}, R^{101e}, R^{101f}$, and $R^{101g}$ stand for the same as $R^{101a}, R^{101b}$, and $R^{101c}$ as well as hydrogen atoms, a pair of $R^{101d}$ and $R^{101e}$ or a combination of $R^{101d}, R^{101e}$ and $R^{101f}$ may form a ring, and each of $R^{101d}$ and $R^{101e}$ or each of $R^{101d}, R^{101e}$ and $R^{101f}$ is an alkylene group of 3 to 10 carbon atoms when they form a ring, $R^{101d}, R^{101e}, R^{101f}$, and $R^{101g}$, taken together, represent a heterocyclic aromatic ring having the nitrogen atom in the formula incorporated therein;

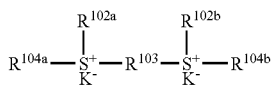
(P1b)

wherein $R^{102a}$ and $R^{102b}$ independently represent straight, branched or cyclic alkyl groups of 1 to 8 carbon atoms, $R^{103}$ represents a straight, branched or cyclic alkylene group of 1 to 10 carbon atoms, $R^{104a}$ and $R^{104b}$ independently represent 2-oxoalkyl groups of 3 to 7 carbon atoms, and K is anon-nucleophilic counter ion;

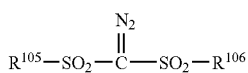
(P2)

wherein $R^{105}$ and $R^{106}$ independently represent straight, branched or cyclic alkyl or halogenated alkyl groups of 1 to 12 carbon atoms, aryl or halogenated aryl groups of 6 to 20 carbon atoms, or aralkyl groups of 7 to 12 carbon atoms;

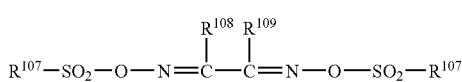
(P3)

wherein $R^{107}, R^{108}$, and $R^{109}$ independently represent straight, branched or cyclic alkyl or halogenated alkyl groups of 1 to 12 carbon atoms, aryl or halogenated aryl groups of 6 to 20 carbon atoms, or aralkyl groups of 7 to 12 carbon atoms, $R^{108}$ and $R^{109}$, taken together, may form a ring, and $R^{108}$ and $R^{109}$ each are straight or branched alkylene groups of 1 to 6 carbon atoms when they form a ring;

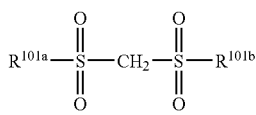
(P4)

wherein $R^{101a}$ and $R^{101b}$ are as defined above; and

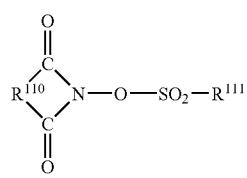
(P5)

wherein $R^{110}$ is an arylene group of 6 to 10 carbon atoms, an alkylene group of 1 to 6 carbon atoms, or an alkenylene group of 2 to 6 carbon atoms wherein some or all of the hydrogen atoms may be replaced by straight or branched alkyl or alkoxy groups of 1 to 4 carbon atoms, nitro, acetyl, or phenyl groups, $R^{111}$ is a straight, branched or cyclic alkyl group of 1 to 8 carbon atoms, alkenyl, alkoxyalkyl, phenyl or naphthyl group, wherein some or all of the hydrogen atoms may be replaced by alkly or alkoxy groups of 1 to 4 carbon atoms, phenyl groups which may have substituted thereon an alkyl or alkoxy of 1 to 4 carbon atoms, nitro, or acetyl group, hetero-aromatic groups of 3 to 5 carbon atoms, or chlorine or fluorine atoms.

9. The undercoat-forming material of claim 8, further comprising an organic solvent, and a crosslinker.

10. An undercoat-forming material comprising:
(a) a novolak resin having a fluorene or tetrahydrospiro-biindene structure comprising recurring units of the general formula (1a) or (1b):

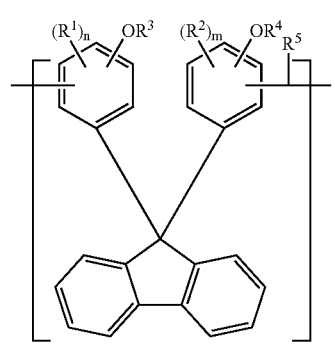
(1a)

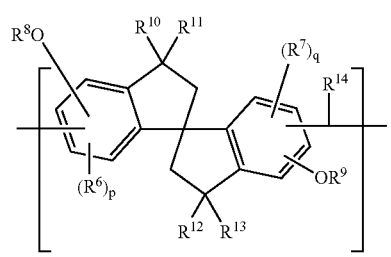
(1b)

wherein $R^1, R^2, R^6$ and $R^7$ are each independently hydrogen, a straight, branched or cyclic $C_1$-$C_{10}$ alkyl group, a $C_6$-$C_{10}$ aryl group, allyl or halogen atom; $R^3, R^4, R^8$ and $R^9$ are each independently hydrogen, a straight, branched or cyclic $C_1$-$C_6$ alkyl group, a straight, branched or cyclic $C_2$-$C_6$ alkenyl group, a $C_6$-$C_{10}$ aryl group or a glycidyl group; $R^5$ and $R^{14}$ are each independently hydrogen, a straight, branched or cyclic $C_1$-$C_{10}$ alkyl group or a $C_6$-$C_{10}$ aryl group; n, m, p and q are each an integer of 1 to 3; $R^{10}$ to $R^{13}$ are each independently hydrogen, halogen, hydroxyl, a straight, branched or cyclic $C_1$-$C_6$ alkyl group or a straight, branched or cyclic $C_1$-$C_6$ alkoxy group, (b) an acid generator selected from the group consisting of:

(i) onium salts of the formula (P1a-1), (P1a-2), (P1a-3) or (P1b), (ii) diazomethane derivatives of the formula (P2), (iii) glyoxime derivatives of the formula (P3), (iv) bissulfone derivatives of the formula (P4), (v) sulfonic acid esters of N-hydroxyimide compounds of the formula (P5), (vi) β-ketosulfonic acid derivatives, (vii) disulfone derivatives, (viii) nitrobenzylsulfonate derivatives; and (ix) sulfonate derivatives;

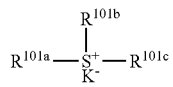
(P1a-1)

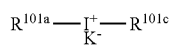
(P1a-2)

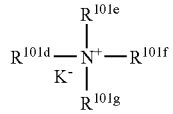
(P1a-3)

wherein $R^{101a}, R^{101b}$, and $R^{101c}$ independently represent straight, branched, or cyclic alkyl, alkenyl, oxoalkyl or oxoalkenyl groups of 1 to 12 carbon atoms, aryl groups of 6 to 20 carbon atoms, or aralkyl or aryloxoalkyl groups of 7 to 12 carbon atoms, wherein some or all of the hydrogen atoms may be replaced by alkoxy or other groups; $R^{101b}$ and $R^{101c}$, taken together, may form a ring; $R^{101b}$ and $R^{101c}$ each are alkylene groups of 1 to 6 carbon atoms when they form a ring; K is a non-nucleophilic counter ion; $R^{101d}, R^{101e}, R^{101f}$, and $R^{101g}$ stand for the same as $R^{101a}, R^{101b}$, and $R^{101c}$ as well as hydrogen atoms, a pair of $R^{101d}$ and $R^{101e}$ or a combination of $R^{101d}, R^{101e}$ and $R^{101f}$ may form a ring and each of $R^{101d}$ and $R^{101e}$ or each of $R^{101d}, R^{101e}$ and $R^{101f}$ is an alkylene group of 3 to 10 carbon atoms when they form a ring $R^{101d}, R^{101e}, R^{101f}$, and $R^{101g}$, taken together, represent a heterocycl aromatic ring having the nitrogen atom in the formula incorporated therein;

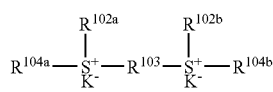
(P1b)

wherein, $R^{102a}$ and $R^{102b}$ independently represent straight, branched or cyclic alkyl groups of 1 to 8 carbon atoms, $R^{103}$ represents a straight, branched or cyclic alkylene group of 1 to 10 carbon atoms, $R^{104a}$ and $R^{104b}$ independently represent 2-oxoalkyl groups of 3 to 7 carbon atoms, K is a non-nucleophilic counter ion;

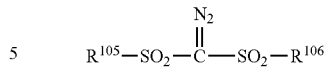
(P2)

wherein, $R^{105}$ and $R^{106}$ independently represent straight, branched or cyclic alkyl or halogenated alkyl groups of 1 to 12 carbon atoms, aryl or halogenated aryl groups of 6 to 20 carbon atoms, or aralkyl groups of 7 to 12 carbon atoms;

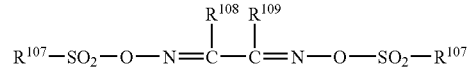
(P3)

wherein, $R^{107}, R^{108}$, and $R^{109}$ independently represent straight, branched or cyclic alkyl or halogenated alkyl groups of 1 to 12 carbon atoms, aryl or halogenated aryl groups of 6 to 20 carbon atoms, or alalkyl groups of 7 to 12 carbon atoms, $R^{108}$ and $R^{109}$, taken together, may form a ring, $R^{108}$ and $R^{109}$ each are straight or branched alkylene groups of 1 to 6 carbon atoms when they form a ring;

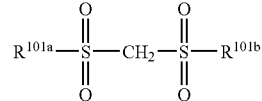
(P4)

wherein, $R^{101a}$ and $R^{101b}$ are as defined above; and

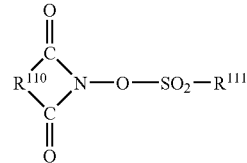
(P5)

wherein, $R^{110}$ is an arylene group of 6 to 10 carbon atoms, alkylene group of 1 to 6 carbon atoms, or alkenylene group of 2 to 6 carbon atoms wherein some or all of the hydrogen atoms may be replaced by straight or branched alkyl or alkoxy groups of 1 to 4 carbon atoms, nitro, acetyl, or phenyl groups, $R^{111}$ is a straight, branched or cyclic alkyl group of 1 to 8 carbon atoms, alkenyl, alkoxyalkyl, phenyl or naphthyl group wherein some or all of the hydrogen atoms may be replaced by alkyl or alkoxy groups of 1 to 4 carbon atoms, phenyl gorups which may have substituted thereon an alkyl or alkoxy of 1 to 4 carbon atoms, nitro, or acetyl group, hetero-aromatic groups of 3 to 5 carbon atoms, or chlorine or fluorine atoms, wherein the novolak resin is modified by introducing a fused aromatic or cycloaliphatic substituent group into the novolak resin phenol at the ortho or para position, and (c) a crosslinker.

11. A paterning process comprising the steps of:
applying an undercoat-forming material comprising a novolak resin having a fluorene or tetrahydrospirobiindene structure, onto a processable substrate to form an undercoat layer, applying a photoresist composition onto the undercoat layer to form a photoresist layer, exposing the photoresist layer in a predetermined region to radiation, developing the photoresist layer with a developer to form a photoresist pattern, and processing the undercoat layer and the substrate through the patterned photoresist layer as a mask, by means of a dry etching apparatus.

12. The patterning process of claim 11, wherein said photoresist composition comprises a silicon atom-bearing polymer, and the processing step includes dry etching the undercoat layer through the photoresist layer as a mask with an oxygen-based etching gas.

13. A patterning process comprising the steps of:
applying an undercoat-forming material comprising a novolak resin having a fluorene or tetrahydrospirobiindene structure, onto a processable substrate to form an undercoat layer, applying a silicon atom-containing intermediate layer over the undercoat layer, applying a photoresist composition onto the intermediate layer to from a photoresist layer, exposing the photoresist layer in a predetermined region to radiation, developing the photoresist layer with a developer to form a photoresist pattern, processing the intermediate layer through the patterned photoresist layer as a mask, removing the patterned photoresist layer, and processing the undercoat layer and then the substrate through the processed intermediate layer as a mask, the processing steps using a dry etching apparatus.

14. The patterning process of claim 13, wherein said photoresist composition comprises a silicon atom-free polymer, and the step of processing the undercoat layer includes dry etching with an oxygen-based etching gas.

15. A patterning process comprising the steps of:
applying an undercoat-forming material onto a processable substrate to form an undercoat layer, applying a photoresist composition onto the undercoat layer to form a photoresist layer, exposing the photoresist layer in a predetermined region to radiation, developing the photoresist layer with a developer to form a photoresist pattern, and processing the undercoat layer and the substrate through the patterned photoresist layer as a mask, by means of a dry etching apparatus, wherein said undercoat-forming material comprises a novolak resin consisting essentially of recurring units obtained by condensation reacting with an aldehyde (A) a phenol having a fluorene structure selected from the group consisting of 4,4'-(9H-fluoren-9-ylidene)bisphenol, 2,2'-dimethyl-4,4'-(9H-fluoren-9-ylidene)bisphenol, 2,2'-diallyl-4,4'-(9H-fluoren-9-ylidene)bisphenol, 2,2'-difluoro-4,4'-(9H-fluoren-9-ylidene)bisphenol, 2,2'-diphenyl-4,4'-(9H-fluoren-9-ylidene)bisphenol, and 2,2'-dimethoxy-4,4'-(9H-fluoren-9-ylidene)bisphenol, and with (C) a copolymerizable phenol selected from the group consisting of phenol, o-cresol, m-cresol, p-cresol, 2,3-dimethylphenol, 2,5-dimethylphenol, 3,4-dimethylphenol, 3,5-dimethylphenol, 2,4-dimethylphenol, 2,6-dimethylphenol, 2,3,5- trimethylphenol, 3,4,5-trimethylphenol, 2-t-butylphenol, 3-t-butylphenol, 4-t-butylphenol, 2 -phenylphenol, 3-phenylphenol, 4-phenylphenol, 3,5- diphenylphenol, 2-naphthylphenol, 3-naphthylphenol, 4-naphthylphenol, 4-tritylphenol, resorcinol, 2-methylresorcinol, 4-methylresorcinol, 5-methylresorcinol, catechol, 4-t-butylcatechol, 2-methoxyphenol, 3-methoxyphenol, 2-propylphenol, 3- propylphenol, 4-propylphenol, 2-isoproylphenol, 3-isopropylphenol, 4- isopropylphenol, 2-methoxy-5-methylphenol, 2-t-butyl-5-methylphenol, pyrogallol, thymol, and isothymol, and/or (D) a copolymerization monomer selected from the group consisting of 1-napthol, 2-naphthol, 2-methyl-1-naphthol, 4-methoxy-1-naphthol, 7- methoxy-2-naphthol; dihydroxynaphthalenes, methyl 3-hydroxy-naphthalene-2-carboxylate, indene, hydroxyindene, benzofuran, hydroxyanthracene, acenaphthylene, biphenyl, bisphenol, trisphenol, dicyclopentadiene, tetrahydroindene, 4-vinylcyclohexane, norbornadiene, 5- vinylnorborn-2-ene, α-pinene, β-pinene, and limonene, so that the phenol (A), phenol (C), and copolymerizable monomer (D) are combined in such proportion as to meet a molar ratio: [A]/[A+C+D]=0.1 to 1.0.

16. A patterning process comprising the steps of:
applying an undercoat-forming material onto a processable substrate to form an undercoat layer;

applying a silicon atom-containing intermediate layer over the undercoat layer, applying a photoresist composition onto the intermediate layer to form a photoresist layer, exposing the photoresist layer in a predetermined region to radiation, developing the photoresist layer with a developer to form a photoresist pattern, processing the intermediate layer through the patterned photoresist layer as a mask, removing the patterned photoresist layer, and processing the undercoat layer and then the substrate through the processed intermediate layer as a mask, wherein the processing steps are performed using a dry etching apparatus, and wherein said undercoat-forming material comprises a novolak resin consisting essentially of recurring units obtained by condensation reacting with an aldehyde (A) a phenol having a fluorene structure selected from the group consisting of 4,4'-(9H-fluoren-9-ylidene)bisphenol, 2,2'-dimethyl-4,4'-(9H-fluoren-9-ylidene)bisphenol, 2,2'-diallyl-4,4'-(9H-fluoren-9-ylidene)bisphenol, 2,2'-difluoro-4,4'-(9H-fluoren-9-ylidene)bisphenol, 2,2'-diphenol-4,4'-(9H-fluoren-9-ylidene)bisphenol, and 2,2'-dimethoxy-4,4'-(9H-fluoren-9-ylidene)bisphenol, and with (C) a copolymerizable phenol selected from the group consisting of phenol, o-cresol, m-cresol, p-cresol, 2,3- dimethylphenol, 2,5-dimethylphenol, 3,4-dimethylphenol, 3,5- dimethylphenol, 2,4-dimethylphenol, 2,6-dimethylphenol, 2,3,5- trimethylphenol, 3,4,5-trimethylphenol, 2-t-butylphenol, 3-t-butylphenol, 4-t- butylphenol, 2-phenylphenol, 3-phenylphenol, 4-phenylphenol, 3,5- diphenylphenol, 2-naphthylphenol, 3-naphthylphenol, 4-naphthylphenol, 4-tritylphenol, resorcinol, 2-methylresorcinol, 4-methylresorcinol, 5-methylresorcinol, catechol, 4-t-butylcatechol, 2-methoxyphenol, 3-methoxyphenol, 2-propylphenol, 3- propylphenol, 4-propylphenol, 2-isopropylphenol, 3-isopropylphenol, 4- isopropylphenol, 2-methoxy-5-methylphenol, 2-t-butyl-5-methylphenol, pyrogallol, thymol, and isothymol, and/or (D) a copolymerizable monomer selected from the group consisting of 1-naphthol, 2-naphthol, 2-methyl-1-naphthol, 4-methoxy-1-naphthol, 7- methoxy-2-naphthol; dihydroxynaphthalenes, methyl 3-hydroxy-naphthalene-2-carboxylate, indene, hydroxyindene, benzofuran, hydroxyanthracene, acenaphthylene, biphenyl, bisphenol, trisphenol, dicyclopentadiene, tetrahydroindene, 4-vinylcyclohexen, norbornadiene, 5- vinylnorborn-2-ene, α-pinene, β-pinene, and limonene, so that the phenol (A), phenol (C), and copolymerizable monomer (D) are combined in such proportion as to meet a molar ratio: [A]/[A+C+D]=0.1 to 1.0.

17. An undercoat-forming material consisting of:
(a) a novolak resin having a fluorene or tetrahydrospirobiindene structure comprising recurring units of the general formula (1a) or (1b):

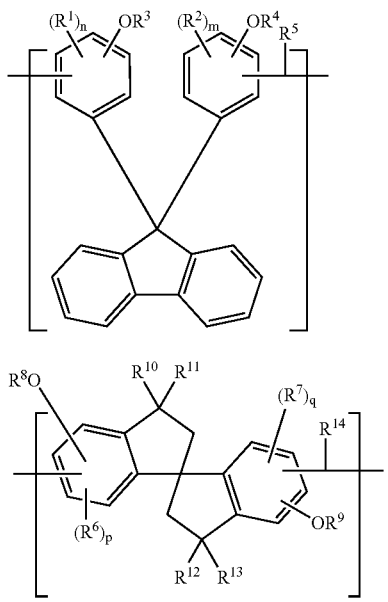

wherein $R^1, R^2, R^6$ and $R^7$ are each independently hydrogen, a straight, branched or cyclic $C_1$-$C_{10}$ alkyl group, a $C_5$-$C_{10}$ aryl group, allyl or halogen atom; $R^3, R^4, R^8$ and $R^9$ are each independently hydrogen, a straight, branched or cyclic $C_1$-$C_6$ alkyl group, a straight, branched or cyclic $C_2$-$C_6$ alkenyl group, a $C_6$-$C_{10}$ aryl group or a glycidyl group; $R^5$ and $R^{14}$ are each independently hydrogen; a straight, branched or cyclic $C_1$-$C_{10}$ alkyl group or a $C_6$-$C_{10}$ aryl group; n, m, p and q are each an integer of 1 to 3; $R^{10}$ to $R^{13}$ are each independently hydrogen, halogen, hydroxyl, a straight, branched or cyclic $C_1$-$C_6$ alkyl group or a straight, branched or cyclic $C_1$-$C_6$ alkoxy group;
(b) an organic solvent;
(c) an acid generator selected from the group consisting of:
(i) onium salts of the formula (Pla-1), (Pla-2), (Pla-3) or (P1b),
(ii) diazomethane derivatives of the formula (P2),
(iii) glyoxime derivatives of the formula (P3),
(iv) bissulfone derivatives of the formula (P4),
(v) sulfonic acid esters of N-hydroxyimide compounds of the formula (P5),
(vi) β-ketosulfonic acid derivatives,
(vii) disulfone derivatives,
(viii) nitrobenzylsulfonate derivatives, and
(ix) sulfonate derivatives:

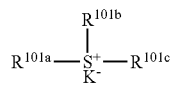

(Pla-1)

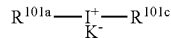

(Pla-2)

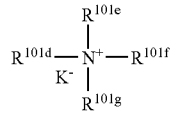

(Pla-3)

wherein, $R^{101a}, R^{101b}$, and $R^{101c}$ independently represent straight, branched or cyclic alkyl, alkenyl, oxoalkyl or oxoalkenyl groups of 1 to 12 carbon atoms, aryl groups of 6 to 20 carbon atoms, or aralkyl or aryloxoalkyl groups of 7 to 12 carbon atoms, wherein some or all of the hydrogen atoms may be replaced by alkoxy or other groups; $R^{101b}$ and $R^{101c}$, taken together, may form a ring; $R^{101b}$ and $R^{101c}$ each are alkylene groups of 1 to 6 carbon atoms when they form a ring; K is a non-nucleophilic counter ion; $R^{101d}, R^{101e}, R^{101f}$, and $R^{101g}$ stand for the same as $R^{101a}, R^{101b}$, and $R^{101c}$ as well as hydrogen atoms; a pair of $R^{101d}$ and $R^{101e}$ or a combination of $R^{101d}, R^{101e}$ and $R^{101f}$ may form a ring, and each of $R^{101d}$ and $R^{101e}$ or each of $R^{101d}, R^{101e}$ and $R^{101f}$ is an alkylene group of 3 to 10 carbon atoms when they form a ring; $R^{101d}, R^{101e}, R^{101f}$, and $R^{101g}$, taken together, represent a heterocyclic aromatic ring having the nitrogen atom in the formula incorporated therein;

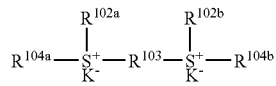

(P1b)

wherein $R^{102a}$ and $R^{102b}$ independently represent straight, branched, or cyclic alkyl groups of 1 to 8 carbon atoms, $R^{103}$ represents a straight, branched or cyclic alkylene group of 1 to 10 carbon atoms, $R^{104a}$ and $R^{104b}$ independently represent 2-oxoalkyl groups of 3 to 7 carbon atoms, and K is a non-nucleophilic counter ion;

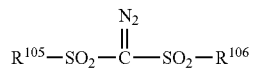

(P2)

wherein $R^{105}$ and $R^{106}$ independently represent straight, branched or cyclic alkyl or halogenated alkyl groups of 1 to 12 carbon atoms, aryl or halogenated aryl groups of 6 to 20 carbon atoms, or aralkyl groups of 7 to 12 carbon atoms;

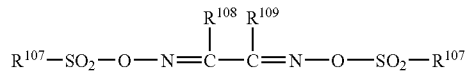

(P3)

wherein $R^{107}, R^{108}$, and $R^{109}$ independently represent straight, branched or cyclic alkyl or halogenated alkyl groups of 1 to 12 carbon atoms, aryl or halogenated aryl groups of 6 to 20 carbon atoms, or aralkyl groups of 7 to 12 carbon atoms, $R^{108}$ and $R^{109}$, taken together, may form a ring, and $R^{108}$ and $R^{109}$ each are straight or branched alkylene groups of 1 to 6 carbon atoms when they form a ring;

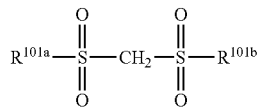
(P4)

wherein $R^{101a}$ and $R^{101b}$ are as defined above; and

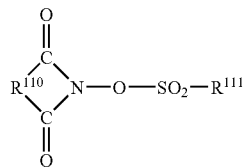
(P5)

wherein $R^{110}$ is an arylene group of 6 to 10 carbon atoms, an alkylene group of 1 to 6 carbon atoms, or an alkenylene group of 2 to 6 carbon atoms wherein some or all of the hydrogen atoms may be replaced by straight or branched alkyl or alkoxy groups of 1 to 4 carbon atoms, nitro, acetyl, or phenyl groups; $R^{111}$ is a straight, branched or cyclic alkyl group of 1 to 8 carbon atoms, alkenyl, alkoxyalkyl, phenyl, or naphthyl group, wherein some or all of the hydrogen atoms may be replaced by alkyl or alkoxy groups of 1 to 4 carbon atoms, phenyl groups which may have substituted thereon an alkyl or alkoxy of 1 to 4 carbon atoms, nitro, or acetyl group, hetero-aromatic groups of 3 to 5 carbon atoms, or chlorine or fluorine atoms; and (d) a crosslinker.

18. The undercoat-forming material of claim 17, wherein the novolak resin is one obtained by condensation reacting with an aldehyde (A) a phenol having a fluorene structure selected from the group consisting of 4,4'-(9H-fluoren-9-ylidene)bisphenol,
2,2'-dimethyl-4,4'-(9H-fluoren-9-ylidene)bisphenol,
2,2'-diallyl-4,4'-(9H-fluoren-9-ylidene)bisphenol,
2,2'-difluoro-4,4'-(9H-fluoren-9-ylidene)bisphenol,
2,2'-diphenyl-4,4'-(9H-fluoren-9-ylidene)bisphenol, and
2,2'-dimethoxy-4,4'-(9H-fluoren-9-ylidene)bisphenol, and/or (B) a phenol having a tetrahydrospirobiindene structure selected from the group consisting of 2,3,2',3'-tetrahydro-(1,1')-spirobiindene-6,6'-diol, 3,3,3',3'-tetramethyl-2,3,2',3'-tetrahydro-(1,1')-spirobiindene-6,6'-diol, 3,3,3',3',4,4'-hexamethyl-2,3,2',3'-tetrahydro-(1,1')-spirobiindene-6,6'-diol, 2,3,2',3'-tetrahydro-(1,1')-spirobiindene-5,5'-diol, and 5,5'-dimethyl-3,3,3',3'-tetramethyl-2,3,2',3'-tetrahydro-(1,1')-spirobiindene-6,6'-diol, and optionally with (C) a copolymerizable phenol selected from the group consisting of phenol, o-cresol, m-cresol, p-cresol, 2,3-dimethylphenol, 2,5-dimethylphenol, 3,4-dimethylphenol, 3,5-dimethylphenol, 2,4-dimethyphenol, 2,6-dimethylphenol, 2,3,5-trimethylphenol, 3,4,5-trimethylphenol, 2-t-butylphenol, 3-t-butylphenol, 4-t-butylphenol, 2-phenylphenol, 3-phenylphenol, 4-phenylphenol, 3,5-diphenylphenol, 2-naphthylphenol, 3-naphthylphenol, 4-naphthylphenol, 4-tritylphenol, resorcinol, 2-methylresorcinol, 4-methylresorcinol, 5-methylresorcinol, catechol, 4-t-butylcatechol, 2-methoxyphenol, 3-methoxyphenol, 2-propylphenol, 3-propylphenol, 4-propylphenol, 2-isopropylphenol, 3-isopropylphenol, 4-isopropylphenol, 2-methoxy-5-methylphenol, 2-t-butyl-5-methylphenol, pyrogallol, thymol, and isothymol,and/or (D) a copolymerizable monomer selected from the group consisting of 1-naphthol, 2-naphthol, 2-methyl-1-naphthol, 4-methoxy-1-naphthol, 7-methoxy-2-naphthol; dihydroxynaphthalenes, methyl 3-hydroxy-naphthalene-2-carboxylate, indene, hydroxyindene, benzofuran, hydroxyanthracene, acenaphthylene, biphenyl, bisphenol, trisphenol, dicyclopentadiene, tetrahydroindene, 4-vinylcyclohexene, norbornadiene, 5-vinylnorborn-2-ene, α-pinene, β-pinene, and limonene, so that the phenol (A) and/or (B), additional phenol (C), and copolymerizable monomer (D) are combined in such proportion as to meet a molar ratio: [A+B]/[A+B+C+D]=0.1 to 1.0.

19. A patterning process comprising the steps of:
applying an undercoat-forming material onto a processable substrate to form an undercoat layer;
applying a photoresist composition onto the undercoat layer to form a photoresist layer,
exposing the photoresist layer in a predetermined region to radiation,
developing the photoresist layer with a developer to form a photoresist pattern, and
processing the undercoat layer and the substrate through the patterned photoresist layer as a mask, by means of a dry etching apparatus, wherein said undercoat-forming material consists of:
(a) a novolak resin having a fluorene or tetrahydrospirobiindene structure comprising recurring units of the general formula (1a) or (1b):

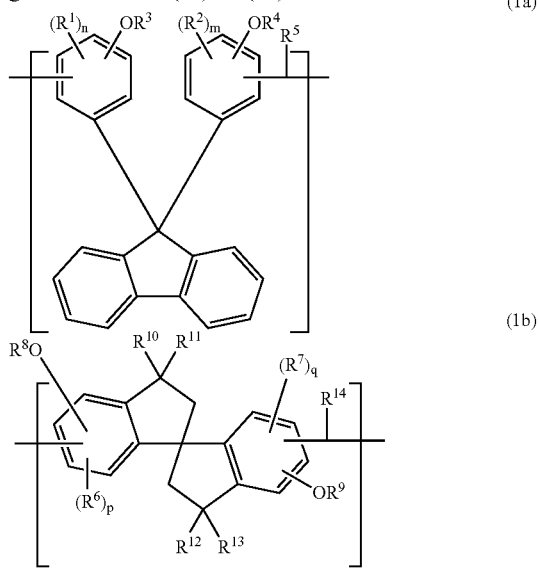

wherein $R^1, R^2, R^6$ and $R^7$ are each independently hydrogen, a straight, branched or cyclic $C_1$-$C_{10}$ alkyl group, a $C_6$-$C_{10}$ aryl group, allyl or halogen atom; $R^3, R^4, R^8$ and $R^9$ are each independently hydrogen, a straight, branched or cyclic $C_1$-$C_6$ alkyl group, a straight, branched or cyclic $C_2$-$C_6$ alkenyl group, a $C_6$-$C_{10}$ aryl group or a glycidyl group; $R^5$ and $R^{14}$ are each independently hydrogen, a straight, branched or cyclic $C_1$-$C_{10}$ alkyl group or a $C_6$-$C_{10}$ aryl group; n, m, p and q are each an integer of 1 to 3; $R^{10}$ to $R^{13}$ are each independently hydrogen, halogen, hydroxyl, a straight, branched or cyclic $C_1$-$C_6$ alkyl group or a straigh, branched or cyclic $C_1$-$C_6$ alkoxy group;
(b) an organic solvent;
(c) an acid generator; and
(d) a crosslinker.

20. A patterning process comprising the steps of:
applying an undercoat-forming material onto a processable substrate to form an undercoat layer, applying a silicon atom-containing intermediate layer over the undercoat layer, applying a photoresist composition onto the intermediate layer to form a photoresist layer, exposing the photoresist layer in a predetermined region to radiation, developing the photoresist layer with a developer to form a photoresist pattern, processing the intermediate layer through the patterned photoresist layer as a mask, removing the patterned photoresist layer, and processing the undercoat layer and then the substrate through the processed intermediate layer as a mask, wherein the processing steps are performed using a dry etching apparatus, and wherein said undercoat-forming material consists of:

(a) a novolak resin having a fluorene or tetrahydrospirobiindene structure comprising recurring units of the general formula (1a) or (1b):

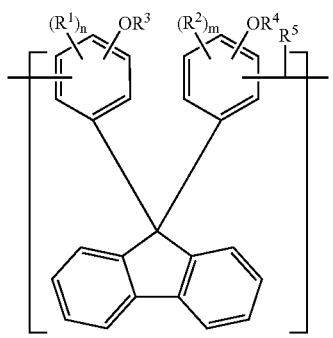

(1a)

-continued

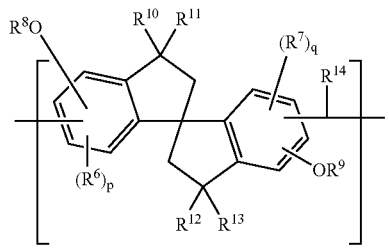

(1b)

wherein $R^1, R^2, R^6$ and $R^7$ are each independently hydrogen, a straight, branched or cyclic $C_1$-$C_{10}$ alkyl group, a $C_6$-$C_{10}$ aryl group, allyl or halogen atom; $R^3, R^4, R^8$ and $R^9$ are each independently hydrogen, a straight, branched or cyclic $C_1$-$C_6$ alkyl group, a straight, branched or cyclic $C_2$-$C_6$ alkenyl group, a $C_6$-$C_{10}$ aryl group or a glycidyl group; $R^5$ and $R^{14}$ are each independently hydrogen, a straight, branched or cyclic $C_1$-$C_{10}$ alkyl group or a $C_6$-$C_{10}$ aryl group; n, m, p and q are each an integer of 1 to 3; $R^{10}$ to $R^{13}$ are each independently hydrogen, halogen, hydroxyl, a straight, branched or cyclic $C_1$-$C_6$ alkyl group or a straight, branched or cyclic $C_1$-$C_6$ alkoxy group;

(b) an organic solvent;

(c) an acid generator; and (d) a crosslinker.

* * * * *